United States Patent
Fujihira et al.

(10) Patent No.: US 6,221,688 B1
(45) Date of Patent: Apr. 24, 2001

(54) DIODE AND METHOD FOR MANUFACTURING THE SAME

(75) Inventors: Tatsuhiko Fujihira; Yasushi Miyasaka, both of Nagano (JP)

(73) Assignee: Fuji Electric Co. Ltd. (JP)

( * ) Notice: Subject to any disclaimer, the term of this patent is extended or adjusted under 35 U.S.C. 154(b) by 0 days.

(21) Appl. No.: 09/386,058

(22) Filed: Aug. 30, 1999

Related U.S. Application Data

(62) Division of application No. 09/088,808, filed on Jun. 2, 1998.

(30) Foreign Application Priority Data

Jun. 2, 1997 (JP) .................................................. 9-143624

(51) Int. Cl.⁷ ................................................. H01L 21/00
(52) U.S. Cl. ............................. 438/92; 438/167; 438/570
(58) Field of Search ..................................... 257/104, 260, 257/471, 474, 484; 438/92, 167, 560, 570, 534, 983, 91

(56) References Cited

FOREIGN PATENT DOCUMENTS

| 52-008778 | * | 1/1977 | (JP) . |
| 52-008780 | * | 1/1977 | (JP) . |
| 6-177365 | * | 6/1994 | (JP) . |

* cited by examiner

*Primary Examiner*—Olik Chaudhuri
*Assistant Examiner*—Hoai Pham
(74) *Attorney, Agent, or Firm*—Rossi & Associates

(57) ABSTRACT

A diode is provided which includes a first-conductivity-type cathode layer, a first-conductivity-type drift layer placed on the cathode region and having a lower concentration than the cathode layer, a generally ring-like second-conductivity-type ring region formed in the drift layer, second-conductivity-type anode region formed in the drift layer located inside the ring region, a cathode electrode formed in contact with the cathode layer, and an anode electrode formed in contact with the anode region, wherein the lowest resistivity of the second-conductivity-type anode region is at least 1/100 of the resistivity of the drift layer, and the thickness of the anode region is smaller than the diffusion depth of the ring region.

12 Claims, 24 Drawing Sheets

DIODE AND METHOD FOR MANUFACTURING THE SAME

This is a division of application Ser. No. 09/088,808 filed Jun. 2, 1998.

FIELD OF THE INVENTION

The present invention relates to a pn junction diode having a pn junction, a Schottky diode having a Schottky junction, and a composite diode having both of the pn junction and Schottky junction, each of these diodes having a rectifying function.

BACKGROUND OF THE INVENTION

Diodes having a rectifying function are the most fundamental semiconductor elements or components, and various types of diodes are known which have different junction structures.

FIG. 37 is a cross-sectional view showing a pn junction diode 101 having a basic planar-type pn junction. To provide the diode 101, a high-concentration n$^+$ cathode layer 1 is formed on one of opposite surfaces of a low-concentration n drift layer 2, and a p anode region 3 is formed in a surface layer at the other surface of the n drift layer 2. Cathode electrode 4 and anode electrode 5 are formed in contact with the surfaces of the n$^+$ cathode layer 1 and p anode region 3, respectively. The diode 101 further includes an oxide film 6 that covers the surface of the pn junction, and a protective film 7 in the form of a nitride film. A p-type peripheral region 8 is formed in a peripheral portion of the pn junction diode 101, and a peripheral electrode 11 is provided on the surface of the peripheral region 8, to extend over a part of the oxide film 6.

The n drift layer 2 is laminated by epitaxial growth on the n$^+$ cathode layer 1 as a substrate. For example, the impurity concentrations of the n$^+$ cathode layer 1 and n drift layer 2 are $1 \times 10^{19}$ cm$^{-3}$, and $1 \times 10^{15}$ cm$^{-3}$, respectively, and the thicknesses of these layers 1, 2 are 450 $\mu$m and 10 $\mu$m, respectively. The p anode region 3 is formed by implanting p-type impurities, such as boron ions, using the oxide film 6 as a mask, and thermally diffusing the implanted ions. The p anode region 3 thus formed has a surface impurity concentration of $1 \times 10^{19}$ cm$^{-3}$, and a diffusion depth of 3 $\mu$m.

The graph of FIG. 38 shows a profile of the resistivity measured along a cross section of the pn junction diode 101 of FIG. 37. In FIG. 38, the vertical axis indicates the thickness as measured from the surface of the semiconductor substrate including the n cathode layer 1 and n drift layer 2, and the horizontal axis indicates the resistivity plotted on a logarithmic scale. As shown in the cross section, the diode 101 includes the p anode region 3 having a thickness of 3 $\mu$m as measured from the surface of the semiconductor substrate, n drift layer 2 having a thickness of about 60 $\mu$m, and the n cathode layer 1 having a low resistivity, which is formed under the n drift layer 2. Generally, the resistivity of a portion of the surface of the p anode region 3 which has the lowest resistance is about 0.01 $\Omega \cdot$m.

FIG. 39 is a cross-sectional view of a pn junction diode 102 which is a slightly modified example of the planar-type diode of FIG. 37. As in the pn junction diode 101 of FIG. 37, a high-concentration n$^+$ cathode layer 1 and a low-concentration n drift layer 2 constitute a semiconductor substrate, and a p anode region 3 is formed in a surface layer of the n drift layer 2 of the semiconductor substrate. The pn junction diode 102 is different from the diode 101 of FIG. 37 in that a p ring region 12 having a ring-like shape and a large diffusion depth is formed at the outer periphery of the p anode region 3. While breakdown of the pn junction diode of FIG. 37 is likely to occur in the vicinity of the periphery of the p anode region 3, the p ring region 12 having a larger diffusion depth than the p anode region 3 is formed in the diode of FIG. 39, so as to decrease the gradient of the impurity concentration, thereby to prevent occurrence of the breakdown at around the p anode region 3. As a result, the breakdown occurs uniformly throughout the p anode region 3.

FIG. 40 is a cross-sectional view of a pn junction diode 103 in which p high-concentration regions 13 having a high surface impurity concentration and a large diffusion depth are formed between p anode regions 3 having a low surface impurity concentration and a small diffusion depth, as disclosed in Shimizu et al., IEEE Trans. on Electron Devices ED-31, (1984) p. 1314). When rated current is applied to the diode, the current flows through the p anode regions 3, and therefore the diode exhibits an excellent reverse recovery characteristic. In the reverse bias situation, a depletion layer spreads out from the p high-concentration regions 13, and thus the diode shows a high breakdown voltage. The p high-concentration regions 13 may also serve as the p ring region 12 as described above.

FIG. 41 is a cross-sectional view of a Schottky diode 104 having a basic Schottky junction. To form the diode 104, a Schottky electrode 15 made of a metal, such as molybdenum, which provides a high Schottky barrier, is formed on a surface of a low-concentration n drift layer 2. A cathode electrode 4 is provided on the rear surface of a n$^+$ cathode layer 1. A p ring region 12 is formed in a surface layer of the n drift layer 2 so as to surround a contact portion of tile Schottky electrode 15. With the p ring region 12 thus provided, an electric field is prevented from concentrating at the edge of the Schottky electrode 15, and the breakdown voltage of the resulting diode can be increased.

The n drift layer 2 is laminated by epitaxial growth on the high-concentration n$^+$ cathode layer 1 serving as a substrate. For example, the n$^+$ cathode layer 1 has a resistivity of 0.004 $\Omega \cdot$cm, and a thickness of 350 $\mu$m, and the n drift layer 2 has a resistivity of 0.90 $\Omega \cdot$cm, and a thickness of 7 $\mu$m.

The graph of FIG. 38 also shows a profile of the resistivity measured along a cross section of the Schottky diode 104 of FIG. 41. The vertical axis indicates the depth as measured from the surface of the semiconductor substrate comprising the n$^+$ cathode layer and ii drift layer 2, and the vertical axis indicates the resistivity plotted on a logarithmic scale. In the case of a Schottky diode having a breakdown voltage of 60V, for example, the n drift layer 2 having a resistivity of 0.9 $\Omega \cdot$cm extends from the surface of the semiconductor substrate to a depth of about 7 $\mu$m, and the n$^+$ cathode layer 1 having a resistivity of 0.004 $\Omega \cdot$cm is formed under the n drift layer 2.

FIG. 42 is a cross-sectional view showing a Schottky diode 105 as a slightly modified example of the Schottky diode 104 of FIG. 41. In the diode 105, trenches 16 are formed in a surface layer of the n drift layer 2, and a Schottky electrode 15 made of molybdenum, for example, is formed on the surface of the n drift layer 2 and the inner walls of the trenches 16. With the trenches 16 thus provided, a contact area of the Schottky electrode 15 is increased, thereby to increase the current capacitance.

FIG. 43 is a cross-sectional view of a composite diode 106 having a pn junction and a Schottky junction. In the composite diode 106, a relatively wide p ring region 12 is formed in a surface layer of an n drift layer 2 so as to surround a contact portion of a Schottky electrode 15, such that the Schottky electrode 15 is in contact with the surface of the p ring region 12 as well as the n drift layer 2, as disclosed in Zettler, R. A. et al.: IEEE Trans. on Electron Devices ED-16, (1969) p. 58. In this case, the p ring region 12 provides a p anode region 3 of a pn junction diode. Thus, the composite diode, in which the pn junction and Schottky junction are combined, provides a low forward voltage when it is forward biased, a high breakdown voltage, and an effect of reducing noise.

FIG. 44 is a cross-sectional view of a composite diode 107 which is a modified example of the composite diode of FIG. 43. In this example, not only the p ring region 12 is formed at the periphery of the n drift layer 2 that contacts with the Schottky electrode 15, but also p anode regions 3 are formed inside the p ring region 12. The Schottky electrode 15 is formed in contact with both exposed portions of the n drift layer 2 and the surfaces of the p anode regions 3, as disclosed in Japanese Patent No. 59-35183. The exposed portions of the n drift layer 2 between the p anode regions 3 have a small width, and a depletion layer spreads out from the p anode regions 3 when a reverse bias is applied, assuring a reduced leakage current.

FIG. 45 is a cross-sectional view of a composite diode 108 which is a slightly modified example of the composite diode 107 of FIG. 44. In this example, a p anode region 3 is formed in a surface layer of the n drift layer 2, and trenches 16 having a larger depth than the p anode region 3 are formed. Further, a Schottky electrode 15 made of molybdenum, for example, is formed in contact with the surface of the p anode region 3 and the inner walls of the trenches 16. In this case, too, the provision of the trenches 15 leads to an increase in the contact area of the Schottky electrode 15, and an increase in the current capacitance.

FIG. 46 is a cross-sectional view of a composite diode 109 which is a slightly modified example of the composite diode 108 of FIG. 45. In this example, trenches 16 are formed in a surface layer of an n drift layer 2, and p anode regions 3 are formed along the inner faces of the trenches 16. Schottky electrode 15 is formed in contact with both a surface layer of the n drift layer 2 where the trenches 16 are not formed, and the surfaces of the p anode regions 3 formed along the inner walls of the trenches (see Kunori, S et al.: Proc. of 1992 Intern. Symp. on Power Semicond. Devices and ICs, Tokyo, (1992) p.69). By providing the trenches 16, and forming the p anode regions 3 on the inner walls of the trenches 16, the leakage current can be reduced in the reverse bias situation.

In the pn junction diodes of FIGS. 37, 39, 40, lifetime killers for accelerating recombination of accumulated carriers are introduced by diffusion of Au or Pt, or irradiation of electron beams, so as to increase the switching speed. However, the introduction of the lifetime killers induces or causes an increase of leakage current. Namely, the leakage current $I_R$ increases if the reverse recovery time $t_{rr}$ is shortened by introducing a lot of lifetime killers, and the reverse recovery time $t_{rr}$, is increased if the leakage current $I_R$ is reduced. Thus, there is a trade-off relationship between the reverse recovery time $t_{rr}$ and the leakage current $I_R$. As another problem, the reverse recovery waveform shows hard recovery if a lot of lifetime killers are introduced.

In the Schottky diode of FIGS. 41 and 42, there is a trade-off relationship between the ON-state voltage $V_F$ and the reverse leakage current $I_R$. The ON-state voltage $V_F$ may be reduced by using a metal having a small barrier height, or lowering the resistance of the n region. In this case, however, the leakage current $I_R$ is undesirably increased in the reverse bias situation. If a metal having a large barrier height is used, or the resistance of the n region is increased, the leakage current $I_R$ is reduced, but the ON-state voltage $V_F$ is increased. Thus, there is a trade-off relationship between the ON-state voltage $V_F$ and the reverse leakage current $I_R$.

The composite diodes of FIG. 43 through FIG. 46 have a parallel structure of pn junction diode and Schottky diode, and make use of advantages of the respective types of diodes. These composite diodes, however, inherit disadvantages or problems of the pn junction diode and Schottky diodes.

Furthermore, conventional diodes generally have a low ability to withstand avalanche breakdown. In particular, the pn junction has a certain radius of curvature at around a corner portion of the p anode region or p ring region, and therefore the ability to withstand avalanche breakdown is lowered due to concentration of an electric field on the corner portion, as compared with that of the planar pn junction. Thus, the conventional diodes tend to break down due to concentration of current that may result in avalanche breakdown.

SUMMARY OF THE INVENTION

It is therefore an object of the present invention to provide a diode having a high switching speed, reduced leakage current, reduced forward voltage, and high ability to withstand avalanche breakdown. It is another object to provide a method for manufacturing such a diode.

To accomplish the above object, the present invention provides a diode comprising: a first-conductivity-type cathode layer as a first region; a first-conductivity-type drift layer as a second region placed on the cathode layer and having a lower impurity concentration than the cathode layer; a generally ring-like second-conductivity-type ring region as a third region formed in a surface layer of the first-conductivity-type drift layer; a second-conductivity-type anode region as a fourth region formed in a surface layer of the first-conductivity-type drift region located inside the ring region; a cathode electrode as a first main electrode formed in contact with the second-conductivity-type cathode layer; and an anode electrode as a second main electrode formed in contact with the second-conductivity-type anode region, wherein a portion of the second-conductivity-type anode region having the lowest resistance has a resistivity which is at least $\frac{1}{100}$ of that of the first-conductivity-type drift layer, and the second-conductivity-type anode region has a thickness which is smaller than a diffusion depth of the second-conductivity-type ring region.

With the diode constructed as described above, the amount of minority carriers injected into the first-conductivity-type drift layer is significantly reduced, and the carriers accumulated in this layer are accordingly reduced, whereby the reverse recovery time is shortened.

Preferably, the lowest resistivity of the second-conductivity-type anode region is in a range of 0.3 to 30 times the resistivity of the first-conductivity-type drift layer. In this case, the accumulated carriers are further reduced, resulting in a further shortened reverse recovery time. Also, lifetime killers are not necessary or only a small amount of lifetime killers need to be introduced so as to control the reverse recovery time to a given value. Accordingly, the leakage current arising upon application of a reverse bias is also considerably reduced.

In the diode as described above, the second-conductivity-type anode region preferably has a diffusion depth in a range of 0.01 to 0.5 μm. In this case, the total amount of impurities is reduced, which is effective to reduce the amount of minority carriers injected into the first-conductivity-type drift layer. If the thickness of the high-resistance second conductivity-type anode region is larger than 0.5 μm, the forward loss in this layer is increased.

In a method for manufacturing the diode as described above, the second-conductivity-type anode region is formed by implanting second-conductivity-type ions in a dose amount of $1\times10^{10}$ to $1\times10^{12}$ cm$^{-2}$, and conducting heat treatment.

According to the manufacturing method as described above, the resistivity of the second-conductivity-type anode region can be easily controlled to be 1/100 or higher than that of the first-conductivity-type drift layer, and its thickness can be easily controlled to 0.5 μm or smaller.

If the heat treatment for forming the second-conductivity-type anode region is conducted at a temperature in a range of 300 to 600° C., the activation rate of impurities provided by ion implantation can be suitably controlled, without significantly changing the junction structure. If the temperature of the heat treatment is less than 300° C. or higher than 600° C., the diffusion depth is undesirably increased.

According to another aspect of the present invention, there is provided a diode comprising: a first-conductivity-type cathode layer having a first impurity concentration; a first-conductivity-type drift layer placed on the cathode layer and having a lower impurity concentration than the cathode layer, the cathode layer and drift layer constituting a semiconductor substrate; a generally ring-like second-conductivity-type third ring region formed in a surface layer of the first-conductivity-type drift layer; a cathode electrode formed in contact with the cathode layer; a Schottky electrode as a third main electrode which contacts with a surface of the semiconductor substrate inside the second-conductivity-type ring region, so as to form a Schottky junction; and a first-conductivity-type low-concentration region as a fifth region formed in a surface layer of the drift layer located inside the second-conductivity-type ring region, the low-concentration region having a higher resistivity than the first-conductivity-type drift layer, and having a thickness that is smaller than a diffusion depth of the second-conductivity-type ring region.

In the diode as described just above, the surface of the semiconductor substrate that contacts with the Schottky electrode provides a first-conductivity-type high-resistance region having a high resistivity, which contributes to reduction of the leakage current during application of a reverse bias.

In particular, if the thickness of the first-conductivity-type high-resistance region is in a range of 0.01 to 3.0 μm, more preferably, in a range of 0.01 to 0.5 μam, the high-resistance region that contacts with Schottky electrode satisfactorily yields the above effect. If this thickness exceeds 0.5 μm, the forward loss is increased in this layer.

Preferably, the highest resistivity of the first-conductivity-type high-resistance region is in a range of 1.2 to 12 times that of the first-conductivity-type drift layer. If the highest resistivity is less than 1.2 times the resistivity of the drift layer, the effect of reducing the leakage current is insufficient. If it exceeds 12 times, on the other hand, the forward loss in this layer is increased to a level that is not negligible.

In a method for manufacturing the diode as described above, the first-conductivity-type high-resistance region is formed by implanting second-conductivity-type ions in a dose amount in a range of $1\times10^{10}$ to $1\times10^{13}$ cm$^{-2}$, preferably, in a range of $1\times10^{10}$ to $1\times10^{12}$ cm$^{-2}$, and conducting heat treatment.

The first-conductivity-type high-resistance region may also be formed by epitaxial growth.

In the manufacturing method as described above, the resistivity of the first-conductivity-type high-resistance region can be easily controlled to be 1.2 to 12 times that of the first conductivity-type drift layer, and its diffusion depth can be easily controlled to a range of 0.1 to 0.5 μm.

If the heat treatment for forming the first-conductivity-type high-resistance region is conducted at a temperature in a range of 300 to 600° C., the activation rate of impurities provided by ion implantation can be suitably controlled, without significantly changing the junction structure. If the temperature of the heat treatment is less than 300° C., the impurities are not sufficiently activated. If the temperature exceeds 600° C., the diffusion depth is increased.

According to a further aspect of the present invention, there is provided a diode comprising: a first-conductivity-type cathode layer having a first impurity concentration, a first-conductivity-type drift layer placed in the cathode layer and having a second impurity concentration that is lower than the first impurity concentration; a second-conductivity-type anode region formed in a surface layer of the first-conductivity-type drift layer; a first-conductivity-type embedded region as a sixth region formed in contact with the first-conductivity-type cathode layer located below the second-conductivity-type anode region, the embedded region having a lower resistivity than the drift layer; a cathode electrode formed in contact with the cathode layer; and an anode electrode formed in contact with the anode region; wherein the first-conductivity-type embedded region is formed only inside an area defined by a vertical projection of the second-conductivity-type anode region.

In the diode constructed as described above, the thickness of the portion of the first-conductivity-type drift layer interposed between the second-conductivity-type anode region and the first-conductivity-type embedded region is reduced. When a reverse bias is applied to this diode, therefore, current that may cause avalanche breakdown flows uniformly through a relatively wide region where the embedded region is formed.

In a diode in which a generally ring-like second-conductivity-type ring region is formed in a surface layer of a first-conductivity-type drift layer, and a second conductivity-type anode region is formed in a surface layer of the first-conductivity-type drift layer located inside the second-conductivity-type ring region, a first-conductivity-type embedded region is formed only inside an area defined by a vertical projection of the second-conductivity-type ring region, and the thickness of the first-conductivity-type drift layer located on the embedded region is smaller than the thickness of the drift layer located under the ring region.

In the diode as described just above, the thickness of the portion of the first-conductivity-type drift layer that is interposed between the second-conductivity-type anode region and the first-conductivity-type embedded region is smaller than that of the drift layer under the second-conductivity-type ring region. When a reverse bias is applied to this diode, therefore, current that may cause the avalanche breakdown flows uniformly through a wide region where the first-conductivity-type embedded region is formed.

In a diode in which a generally ring-like second-conductivity-type ring region is formed in a surface layer of a first-conductivity-type drift layer, and a Schottky electrode which contacts with a surface of a semiconductor substrate inside the second-conductivity-type ring region so as to form a Schottky junction, the first-conductivity-type embedded region is formed only inside an area defined by a vertical projection of the second-conductivity-type ring region, for the same reason as described above, and the thickness of the first-conductivity-type drift layer on the first-conductivity-type embedded region is preferably smaller than that of the drift layer located under the second-conductivity-type ring region.

In one preferred form of the diode as described above, the first-conductivity-type embedded region is formed inside an area defined by a vertical projection of the second-conductivity-type ring region, with a spacing of 5 μm or larger between the periphery of the embedded region and the vertical projection. With this arrangement, current which may cause avalanche breakdown flows uniformly toward the first-conductivity-type embedded region, without affecting the second-conductivity-type ring region.

In a diode including trenches formed in a surface layer of a first-conductivity-type drift layer, a first-conductivity-type embedded region formed in contact with a portion of a first-conductivity-type cathode layer located below the trenches, and a second conductivity-type anode region formed along a surface of the drift layer and inner faces of the trenches, the first-conductivity-type embedded region is formed only inside an area of a vertical projection of the outermost trenches.

In a diode including trenches formed in a surface layer of a first-conductivity-type drift layer, a first-conductivity-type embedded region formed in contact with a portion of a first-conductivity-type cathode layer located below the trenches, and a Schottky electrode which contacts with at least a part of the surface of the first-conductivity-type drift layer and inner faces of the trenches, the first-conductivity-type embedded region is formed only inside an area of a vertical projection defined by the outermost trenches.

With the diode constructed as described above, the electric field is prevented from concentrating at bottom parts of the outermost trenches, and breakdown occurs uniformly between bottom parts of inner trenches and the first-conductivity-type embedded region.

BRIEF DESCRIPTION OF THE DRAWINGS

The invention will be described in greater detail with reference to preferred embodiments thereof and the accompanying drawings, wherein.

DETAILED DESCRIPTION OF THE PREFERRED EMBODIMENTS

Some embodiments of the present invention will be described with reference to the drawings. In the following embodiments, regions and layers to which "n" and "p" are prefixed represent those having electrons and holes as majority carriers, respectively. While n type is regarded as the first conductivity type and p type is regarded as the second conductivity type in these embodiments, these conductivity type may be reversed.

First Embodiment

Figure 1:
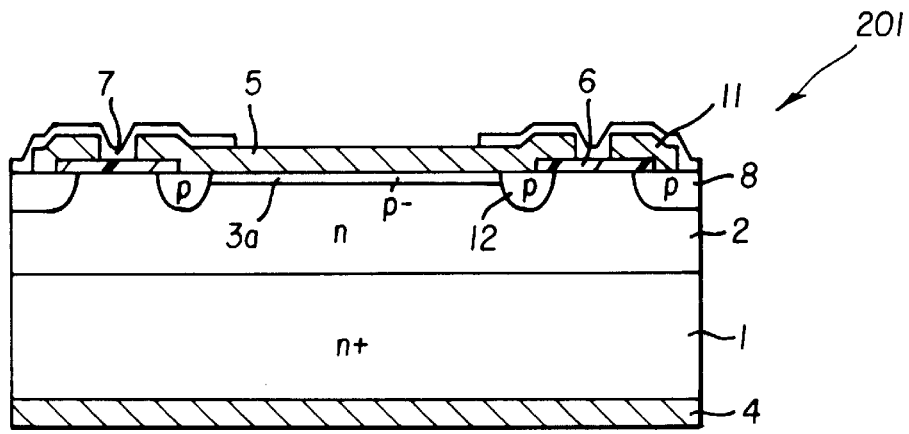
FIG. 1 is a cross-sectional view of a pn junction diode according to the first embodiment of the present invention.
Figure 37:
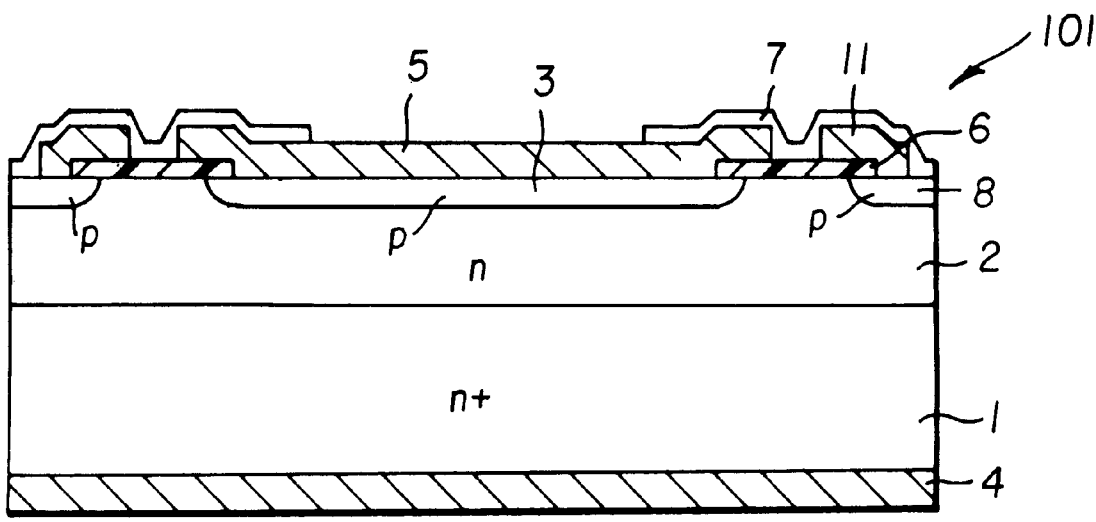
FIG. 37 is a cross-sectional view showing a known example of pn junction diode.
Figure 38:
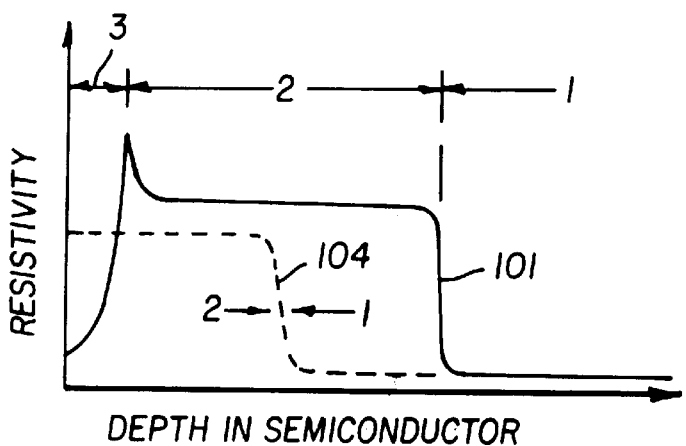
FIG. 38 is a graph showing a profile of the resistivity of each of known pn junction diode and Schottky diode.

FIG. 1 is a cross-sectional view of a pn junction diode 201 having a pn junction according to the first embodiment of the present invention. The diode 201 is different from the known pn junction diode of FIG. 37 in that a p$^-$ anode region 3a having a very small depth is formed in a surface layer of a low-concentration n drift layer 2. Anode electrode 5 and cathode electrode 4, which are in contact with the surface of the p$^-$ anode region 3a and the rear surface of a high-concentration n$^+$ cathode layer 1 formed on the other side of the n drift layer 2 opposite to the p$^-$ anode region 3a, respectively, and oxide film 6 that covers the surface of the pn junction, protective film in the form of a nitride film, and others are similar to those of the known pn junction diode. A p$^-$ type peripheral region 8 is formed in a peripheral portion of the pn junction diode 201, and a peripheral electrode 11 is formed on the surface of the peripheral region 8, to extend over a part of the oxide film 6. Depending upon the case, an n type peripheral region may be provided in place of the p peripheral region 8.

Figure 4A:
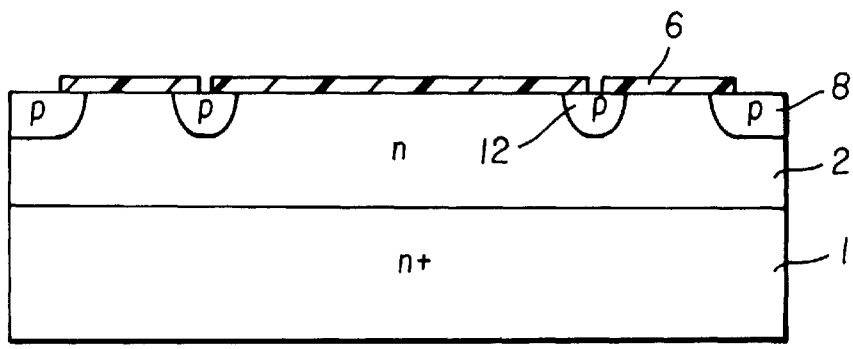
FIG. 4(a) through FIG. 4(d) are cross-sectional views showing main process steps of a method for manufacturing the pn junction diode of the first embodiment.

FIG. 4(a) through FIG. 4(d) are cross-sectional views showing main process steps of a method for manufacturing the pn junction diode 201 of the first embodiment. The n drift layer 2 is laminated by epitaxial growth on the n$^+$ cathode layer 1 as a substrate, which is doped with arsenic, and has a resistivity of 0.004 Ω·cm and a thickness of 350 μm. The n drift layer 2 is doped with phosphorous, and has a resistivity of 40 Ω·m and a thickness of 60 μm. The oxide film 6 is formed by thermally oxidizing the epitaxial wafer thus formed, and patterned by photolithography to provide a mask. Then, a thin oxide film is formed, and the p ring region 12 and p peripheral region 8 are formed in a surface layer of the n drift layer 2, through implantation of boron ions and subsequent thermal diffusion, as shown in FIG. 4(a). The acceleration voltage for ion implantation is 45 keV, and the dose amount is 5×10$^{13}$ cm$^{-2}$. After the ion implantation, annealing is conducted at 1150° C. for 200 min. The surface impurity concentration of the p ring region 12 and p peripheral region 8 is about 2×10$^{17}$ cm$^{-3}$, and the diffusion depth is 3 μm. For lifetime control, gold or platinum is diffused at 700 to 800° C.

Figure 4B:
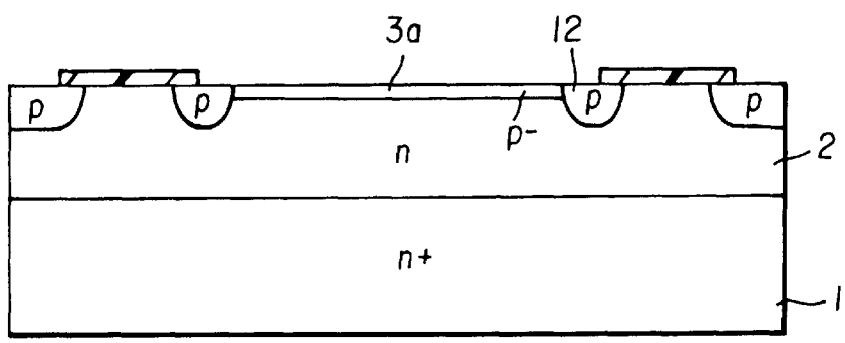

Subsequently, the oxide film 6 located inside the p ring region 12 is removed by photolithography, and the p$^-$ anode region 3a is formed by implantation of boron ions and thermal diffusion, as shown in FIG. 4(b). The acceleration voltage for ion implantation is 45 keV, and the dose amount is 1×10$^{12}$ cm$^{-2}$. After the ion implantation, annealing is conducted at 450° C. for 30 min. The surface impurity concentration of the p$^-$ anode region 3a is 5×10$^{15}$ cm$^{-3}$, and the depth of junction between the p$^-$ anode region 3a and the n drift layer 2 is as small as about 0.3 μm because the annealing temperature is low, and thermal diffusion hardly takes place. The activation rate of the implanted impurities is as low as about 0.1 because of the low annealing temperature.

Figure 4C:
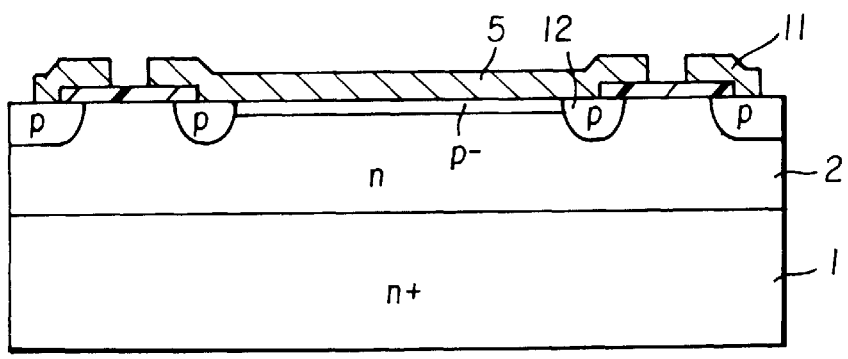

A 5 μm-thickness aluminum alloy is deposited by sputtering on the surface of the structure shown in FIG. 4(b), and patterned by photolithography to thus form the anode electrode 5 and peripheral electrode 11, as shown in FIG. 4(c).

Figure 4D:
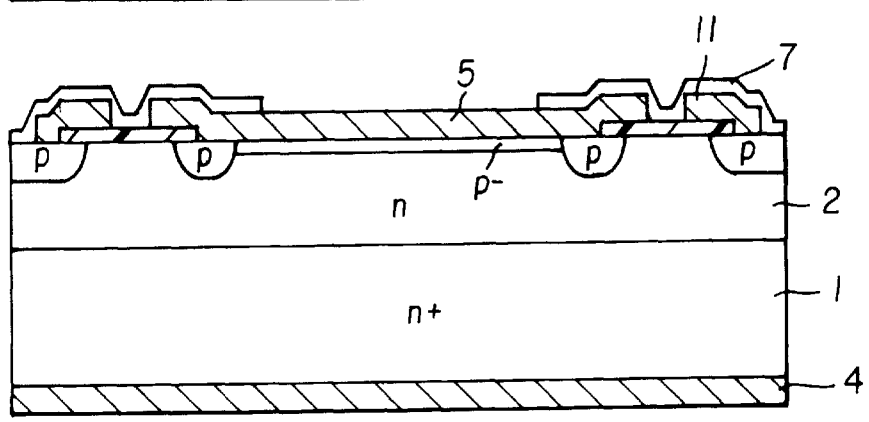

Subsequently, a nitride film is deposited by a plasma CVD method, and patterned by photolithography, to provide the protective film 7, and three layers of titanium, nickel and gold are vapor-deposited on the rear surface of the n$^+$ cathode layer 1, to thus form the cathode electrode 4, as shown in FIG. 4(d).

Figure 2:
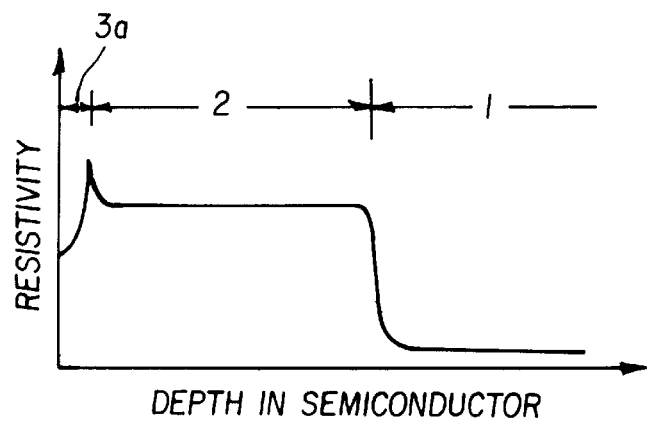
FIG. 2 is a graph showing a profile of the resistivity of the pn junction diode of the first embodiment.

The graph of FIG. 2 shows a profile of the resistivity measured along a cross section of the pn junction diode 201 of FIG. 1. The horizontal axis indicates the depth as measured from tile surface of the semiconductor substrate comprising the n drift layer 2 and n$^+$ cathode layer 1, and the vertical axis indicates the resistivity as plotted on a logarithmic scale. The p$^{31}$ anode region 3a having a depth of 0.3 μm lies at the surface of the semiconductor substrate, and the n drift layer 2 having a thickness of about 60 μm and the n$^+$ cathode layer 1 having a low resistivity are present in this order under the p anode region 3a. A portion of the surface of the p$^{31}$ anode region 3 having the lowest resistance has a resistivity of about 0.8 Ω·cm, which is larger than 0.4 Ω·m which is one-hundredth of the resistivity of the n drift layer 2.

The total amount of impurities contained in the p$^-$ anode region 3a of the pn junction diode 201 of the first embodiment is smaller by about three orders of magnitude than that of the known pn junction diode. Therefore, the amount of minority carriers injected from the p$^-$ anode region 3a into the n drift layer 2 is remarkably reduced, and the reverse recovery time t$_{rr}$ is shortened.

In order to control the reverse recovery time t$_{rr}$ to a given value, on the other hand, the amount of lifetime killers may be about one-tenth of that of the known diode. If the reverse recovery time t$_{rr}$ is to be controlled to 70 ns, for example, platinum that provides lifetime killers may be diffused at a temperature which is 70° C. lower than the known diffusion temperature. Accordingly, the leakage current I$_R$ is also reduced to about one-tenth of that of the known diode. In addition, the reverse recovery waveform exhibits soft recovery owing to increased lifetime.

Second Embodiment

Figure 3:
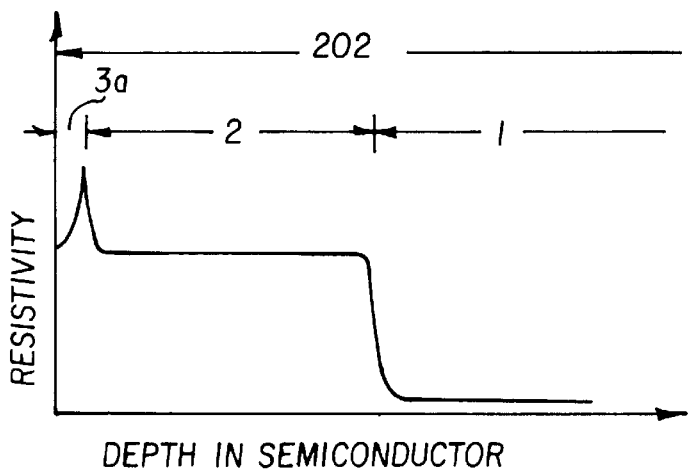
FIG. 3 is a graph showing a profile of the resistivity of a pn junction diode according to the second embodiment of the invention.

The graph of FIG. 3 shows a profile of the resistivity measured along a cross section of a pn diode 202 of the second embodiment of the present invention. In FIG. 3, the horizontal axis indicates the depth as measured from the surface of the semiconductor substrate, and the vertical axis indicates the resistivity as plotted on a logarithmic scale. In the pn junction diode 202, the p⁻ anode region 3a having a depth of 0.3 μm lies at the surface of the semiconductor substrate, and the n drift layer 2 having a thickness of about 60 μm and the n⁺ cathode layer 1 having a low resistivity are present in this order under the p⁻ anode region 3a. In this embodiment, a portion of the surface of the p⁻ anode region 3a having the lowest resistance has a resistivity of about 40 Ω·cm, which is substantially equivalent to the resistivity of the n drift layer 2.

The total amount of impurities contained in the p⁻ anode region 2 of the pn junction diode 202 of the second embodiment is reduced by additional two orders of magnitude than that of the pn junction diode 201 of the first embodiment. Accordingly, a further reduced amount of minority carriers are injected into the n drift layer 2, and the reverse recovery time $t_{rr}$ is shortened.

Figure 5:
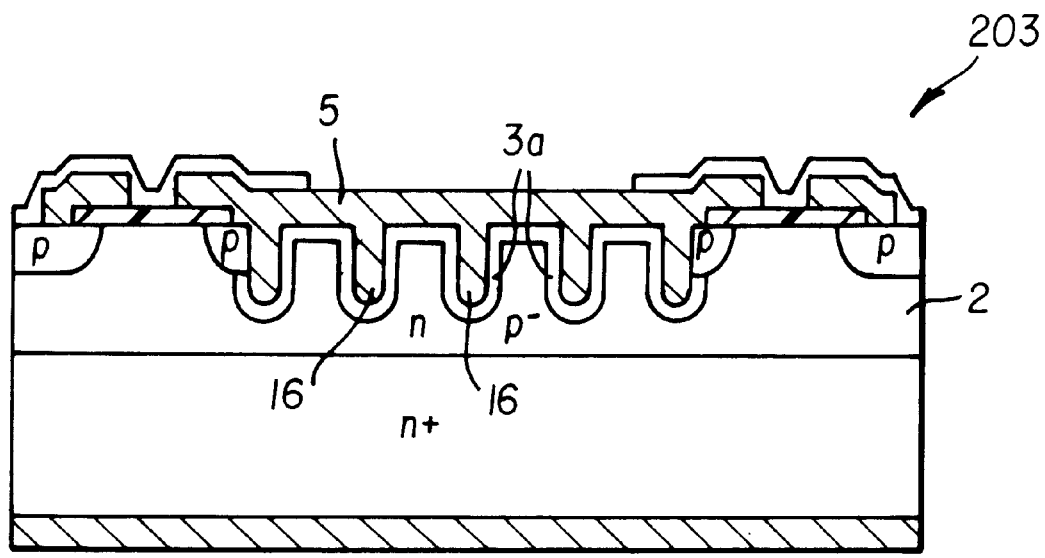
FIG. 5 is a cross-sectional view of a pn junction diode according to the third embodiment of the present invention.

In order to control the reverse recovery time $t_{rr}$ to a given value, the amount of lifetime killers may be about one-twentieth of that of the known diode. Accordingly, the leakage current $I_R$ is also reduced to about one-twentieth of that of the known diode. In addition, the reverse recovery waveform exhibits soft recovery owing to increased lifetime Third Embodiment FIG. 5 is a cross-sectional view of a pn junction diode 203 constructed according to the third embodiment of the present invention. To produce the diode 203, trenches 16 are formed in a surface layer of an n drift layer 2, and a p⁻ anode region 3a having a small diffusion depth is formed at the surface of the n drift layer 2 and the inner faces of the trenches 16, such that the total impurity amount in the region 3a is smaller by some orders of magnitude than that of the known diode, as in the first embodiment. The trenches 16 have a width of 1 μm and a depth of 3 μm, and are arranged at intervals of 2 μm.

In this embodiment, too, the amount of minority carriers injected from the p⁻ anode region 3a into the n drift layer 2 is considerably reduced, and therefore the reverse recovery time $t_{rr}$ is shortened. With the trenches 16 thus provided, the area of the pn junction and the contact area of the anode electrode 5 are increased, with a result of an increase in the current capacitance.

The trenches 16, as viewed in the plane of the substrate, may be in various forms, such as stripes or lattice.

Fourth Embodiment

Figure 6:
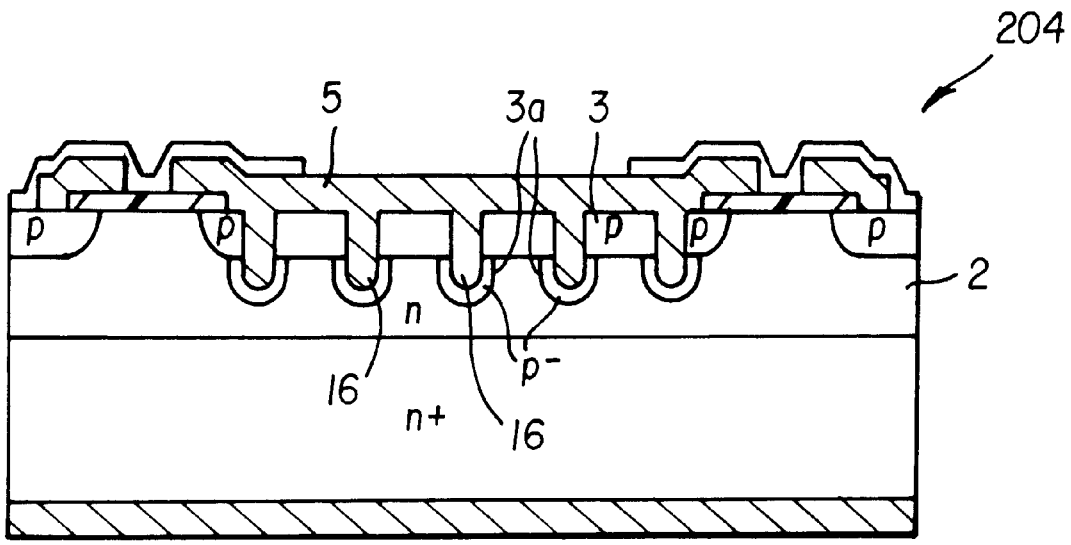
FIG. 6 is a cross-sectional view of a pn junction diode according to the fourth embodiment of tile invention.

FIG. 6 is a cross-sectional view of a pn junction diode 204 according to the fourth embodiment of the present invention. To produce the diode 204, a p anode region 3 having a large total amount of impurities is formed in a surface layer of the n drift layer 2, and trenches 16 having a larger depth than the p anode region 3 are formed in the n drift layer 2 through the p anode region 3. Further, p⁻ anode regions 3a having a small diffusion depth are formed in the inner faces of portions of the trenches 16 that are deeper than the p anode region 3, such that the total impurity amount of the p⁻ anode regions 3a is smaller by some orders of magnitude than that of the known diode, as in the first embodiment. In this embodiment, the p anode region 3 having a large total amount of impurities serves to increase the amount of injection of the minority carriers, in order to reduce the ON-state voltage in a high current region, while the trenches 16 are provided for increasing the contact area between the p anode regions 3a having a small diffusion depth, and the anode electrode 5, thereby to increase the current capacitance.

Fifth Embodiment

Figure 7:
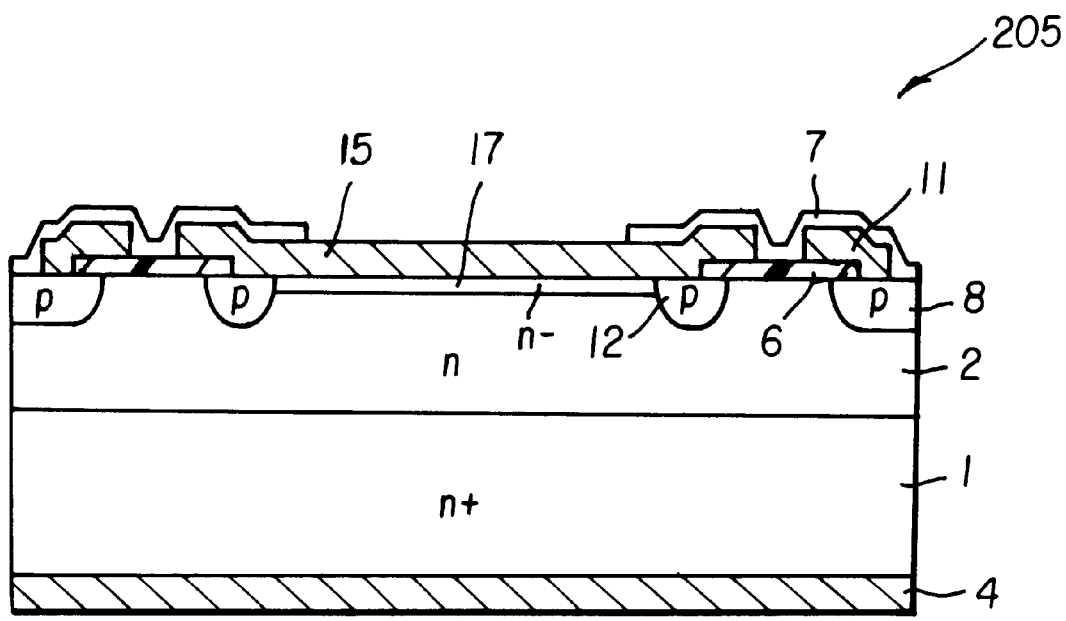
FIG. 7 is a cross-sectional view of a Schottky diode according to the fifth embodiment of the invention.
Figure 39:
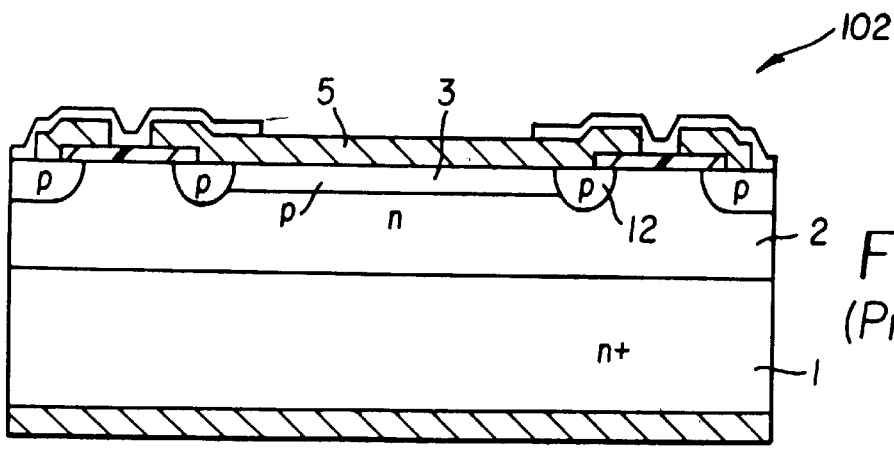
FIG. 39 is a cross-sectional view of another known example of pn junction diode.
Figure 40:
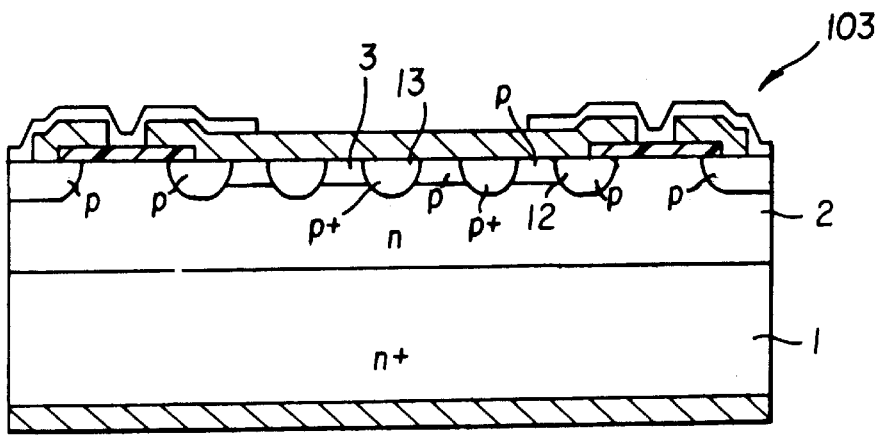
FIG. 40 is a cross-sectional view of a further known example of pn junction diode.

FIG. 7 is a cross-sectional view of a Schottky diode 205 having a Schottky barrier constructed according to the fifth embodiment of the present invention. The Schottky diode 205 is different from the known Schottky diode of FIG. 39 in that an n⁻ high-resistance region 17 having a considerably low impurity concentration is formed in a surface layer of an n drift layer 2, and a Schottky electrode 15 made of a metal that forms a Schottky junction is formed in contact with the n⁻ high-resistance region 17. The other portions of the diode 205, namely, cathode electrode 4 that contacts with the rear surface of the n⁺ cathode layer 1, p ring region 12, oxide film 6 that covers the surface of the pn junction, protective film 7 in the form of a nitride film, and others, are similar to those of the known Schottky diode. A p⁻ type peripheral region 8 is formed in a peripheral portion of the Schottky diode 205, and a peripheral electrode 11 is formed on the surface of the peripheral region 8, to extend over a part of the oxide film 6. Depending upon the case, the p-type peripheral region 8 may be replaced by an n-type peripheral region.

Figure 9A:
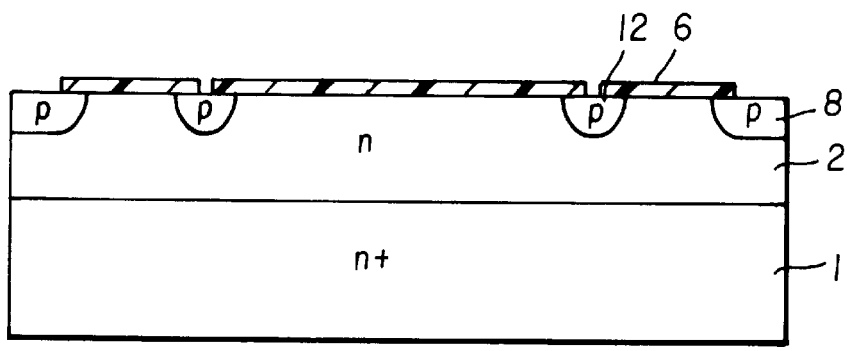
FIG. 9(a) through FIG. 9(d) are cross-sectional views showing main process steps of a method for manufacturing the pn junction diode of the fifth embodiment.

FIG. 9(a) through FIG. 9(d) are cross-sectional views showing main process steps of a method for manufacturing the Schottky diode 205 of the fifth embodiment. The n drift layer 2 is laminated by epitaxial growth on the n⁺ cathode layer 1 as a substrate, which has a resistivity of 0.004 Ω·cm and a thickness of 350 μm. In the case where the Schottky diode has a breakdown voltage of 60V, the n drift layer 2 has a resistivity of 0.55 Ω·m and a thickness of 7 μm. The oxide film 6 is formed by thermally oxidizing the epitaxial wafer thus formed, and patterned by photolithography to provide a mask. Then, a thin oxide film is formed, and the p ring region 12 and p peripheral region 8 are formed in a surface layer of the n drift layer 2, through implantation of boron ions and subsequent thermal diffusion, as shown in FIG. 9(a). The acceleration voltage for ion implantation is 45 keV, and the dose amount is $5 \times 10^{13}$ cm⁻². After the ion implantation, annealing is conducted at 1150° C. for 200 min. The surface impurity concentration of the p ring region 12 and p peripheral region 8 is about $2 \times 10^{17}$ cm⁻³, and the diffusion depth is 3 μm.

Figure 9B:
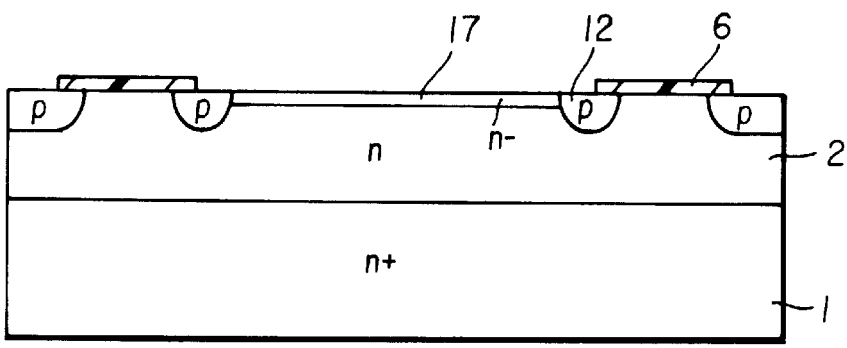

Subsequently, the oxide film 6 located inside the p ring region 12 is removed by photolithography, and the n⁻ high-resistance region 17 is formed by implantation of boron ions and thermal diffusion, as shown in FIG. 9(b). The acceleration voltage for ion implantation is 45 keV, and the dose amount is $1 \times 10^{12}$ cm⁻². After the ion implantation, annealing is conducted at 450° C. for 30 min. Since the dose amount of boron ions is small, the n⁻ high-resistance region 17 having high resistance, rather than a p region having a reversed conductivity type, is formed in the surface layer of the n drift layer 2. The activation rate of the implanted impurities is as low as about 0.1 because of the low annealing temperature, and the resistivity of the resulting surface layer is about 2 Ω·cm.

Figure 9C:
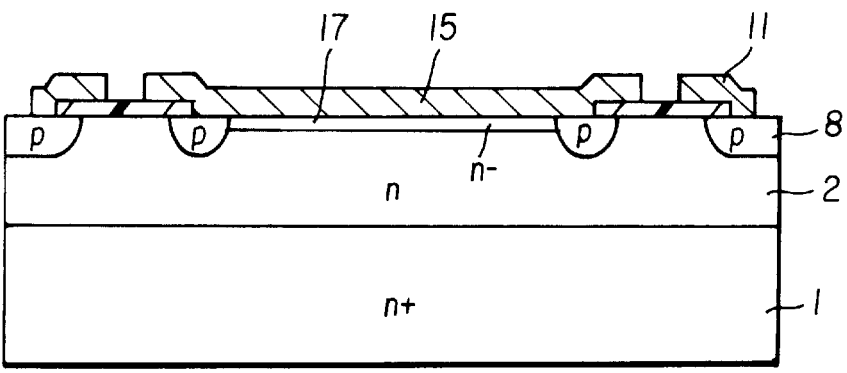

Then, 0.5 μm-thickness molybdenum which provides a barrier metal and a 5 μm-thickness aluminum alloy are successively deposited by sputtering on the surface of the structure shown in FIG. 9(b), and patterned by photolithography to thus form the Schottky electrode 15 and peripheral electrode 11, respectively, as shown in FIG. 9(c).

Figure 9D:
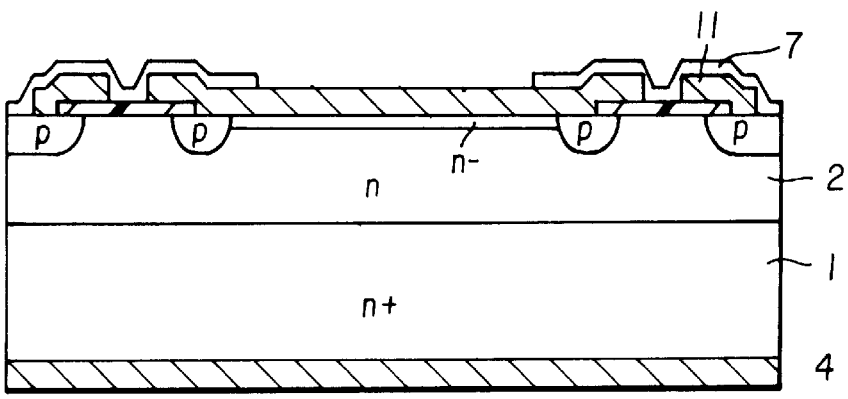

Subsequently, a nitride film is deposited by a plasma CVD method, and patterned by photolithography, to provide a protective film 7, and three layers of titanium, nickel and gold are vapor-deposited on the rear surface of the n⁺ cathode layer 1, to this form the cathode electrode 4, as shown in FIG. 9(d).

Figure 8:
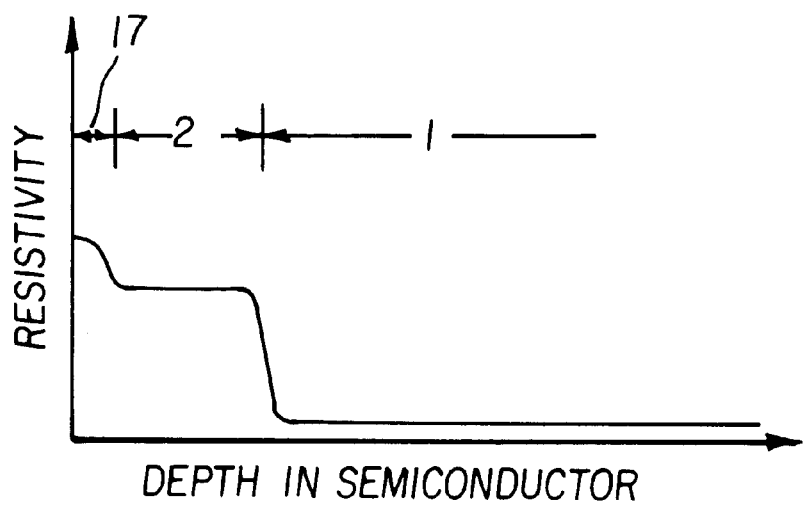
FIG. 8 is a graph showing a profile of the resistivity of the Schottky diode of the fifth embodiment.

The graph of FIG. 8 shows a profile of the resistivity measured along a cross section of the Schottky diode 205 of FIG. 7. The horizontal axis indicates the depth as measured from the surface of the semiconductor substrate, and the vertical axis indicates the resistivity as plotted on a logarithmic scale. The n⁻ high-resistance region 17 having a depth of 0.3 μm lies at the surface of the semiconductor substrate, and the n drift layer 2 having a thickness of about 7 μm and the n⁺ cathode layer 1 having a low resistivity are present in this order under the n– high-resistance region 17. A portion of the surface of the high-resistance region 17 having the lowest resistance has a resistivity of about 2 Ω·cm, which is larger than 0.55 Ω·m that is the resistivity of the n drift layer 2.

In the Schottky diode 205 of the fifth embodiment, the portion of the semiconductor substrate which contacts with the Schottky electrode 15 has a higher resistivity than that of the known Schottky diode, and therefore the leakage current $I_R$ is reduced to about ½ of that of the known diode. In addition, since the resistivity of the n drift layer 2 is relatively low, the forward voltage $V_F$ is lowered by about 0.04 V upon application of the rated current, as compared with that of the known Schottky diode. The reverse recovery time $t_{rr}$ is substantially the same as that of the known diode. In the case of a Schottky diode of 30V-class breakdown voltage, the resistivity and thickness of the n drift layer 2 are controlled to 0.33 Ω·cm and 6 μm, respectively, and the maximum resistivity of the n⁻ high-resistance region is controlled to 1 Ω·cm, so as to provide similar effects.

Sixth Embodiment

Figure 10:
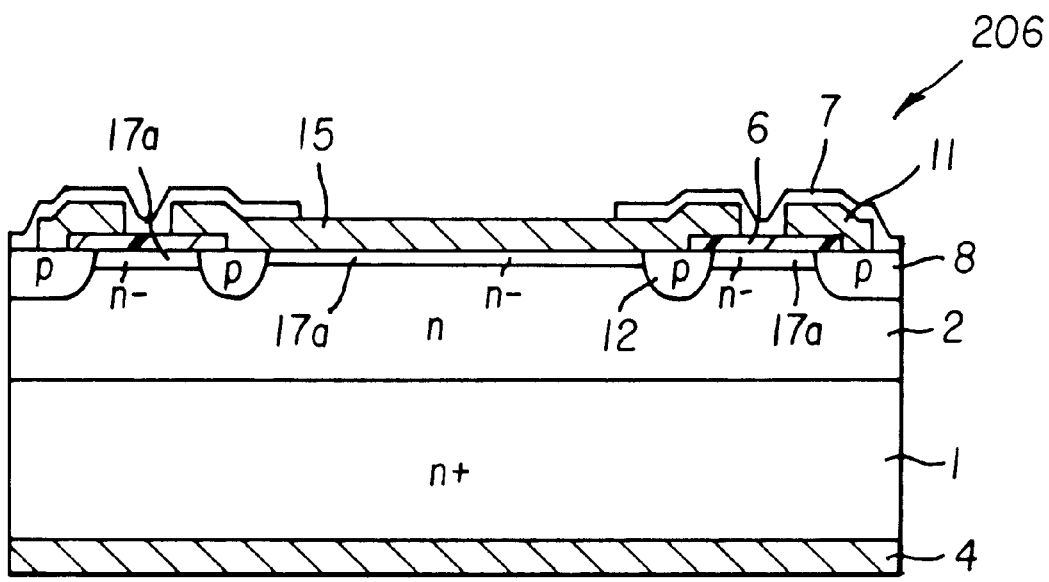
FIG. 10 is a cross-sectional view of a Schottky diode according to the sixth embodiment of the invention.

FIG. 10 is a cross-sectional view of a Schottky diode 206 having a Schottky barrier according to the sixth embodiment of the present invention. Although the basic structure of the Schottky diode 206 of the sixth embodiment is the same as that of the Schottky diode 205 of the fifth embodiment, these diodes 205, 206 are fabricated in different methods. As a result, an n⁻ high-resistance region 17a is formed outside the p ring region 12 as well as inside this region.

Figure 12A:
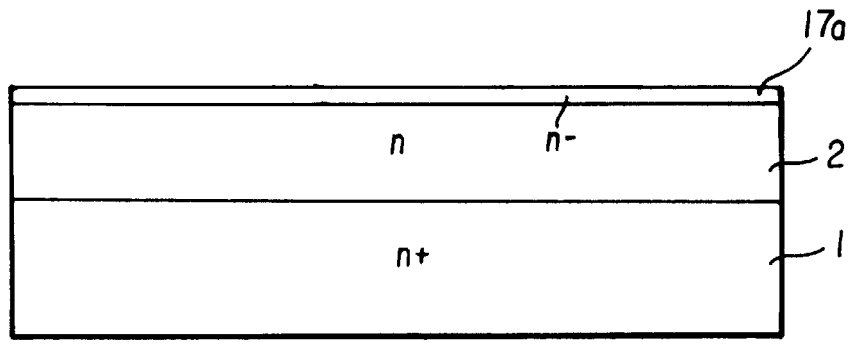
FIG. 12(a) through FIG. 12(d) are cross-sectional views showing main process steps of a method for manufacturing the pn junction diode of the sixth embodiment.

FIG. 12(a) through FIG. 12(d) are cross-sectional views showing main process steps of a method for manufacturing the Schottky diode 206 of the sixth embodiment. An n drift layer 2 having a resistivity of 0.55 Ω·cm and a thickness of 7 μm is laminated by epitaxial growth on an n⁺ cathode layer 1 as a substrate, which has a resistivity of 0.004 Ω·cm and a thickness of 350 μm, and the n⁻ high-resistance region 17a having a resistivity of 0.9 Ω·cm and a thickness of 2 μm is then laminated by epitaxial growth on the n drift layer 2, as shown in FIG. 12(a).

A 1 μm-thickness oxide film 6 is formed by CVD method on the epitaxial wafer thus obtained, and patterned by photolithography. Then, a thin oxide film is formed, and a p ring region 12 and a p peripheral region 8 are formed in a surface layer of the n drift layer 2, through implantation of boron ions and thermal diffusion, as shown in FIG. 12(a). The conditions for ion implantation are substantially the same as those of the fifth embodiment.

Figure 12B:
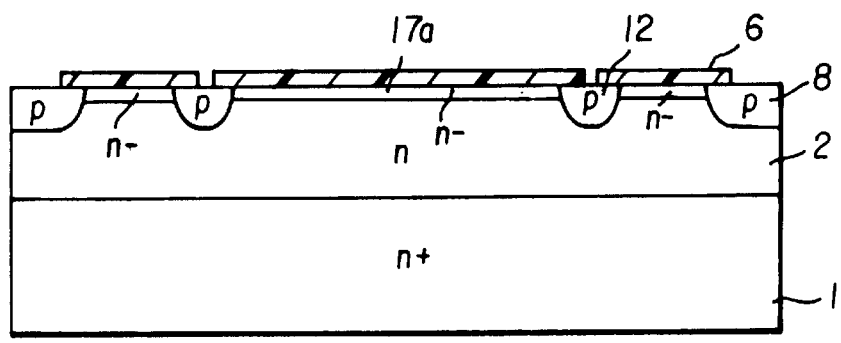
Figure 12C:
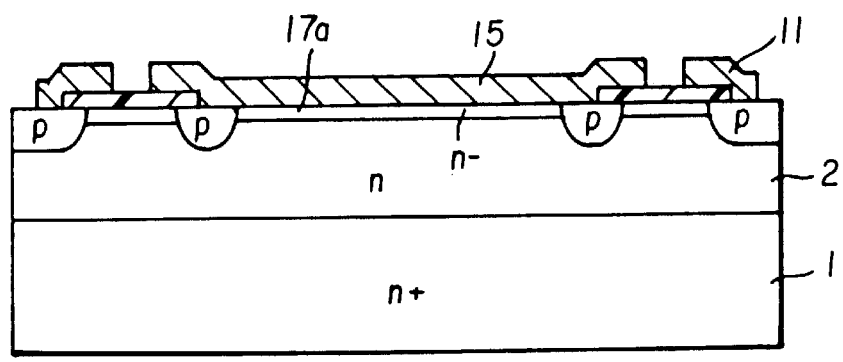

Subsequently, molybdenum and aluminum alloy are deposited by sputtering on the surface of the structure shown in FIG. 12(b), and patterned by photolithography to thus form a Schottky electrode 15 and a peripheral electrode 11, respectively, such that the Schottky electrode 15 is in contact with the n⁻ high-resistance region 17a, as shown in FIG. 12(c).

Figure 12D:
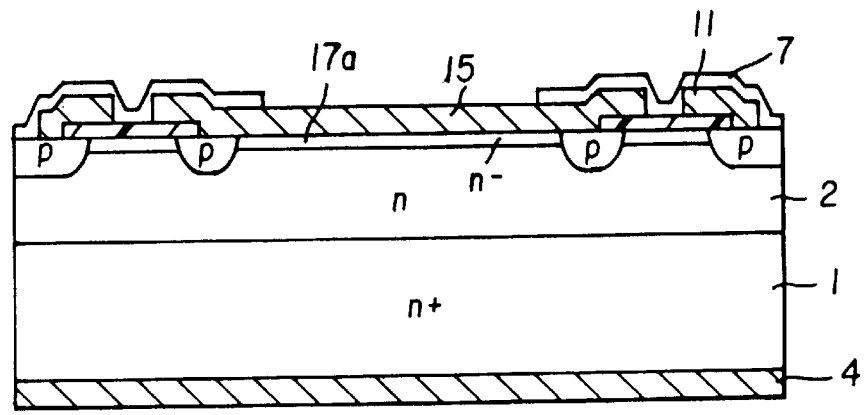

Then, a nitride film is deposited by a plasma CVD method, and patterned by photolithography, to provide a protective film 7, and three layers of titanium, nickel and gold are vapor-deposited on the rear surface of the n⁺ cathode layer 1, to thus form a cathode electrode 4, as shown in FIG. 12(d).

Figure 11:
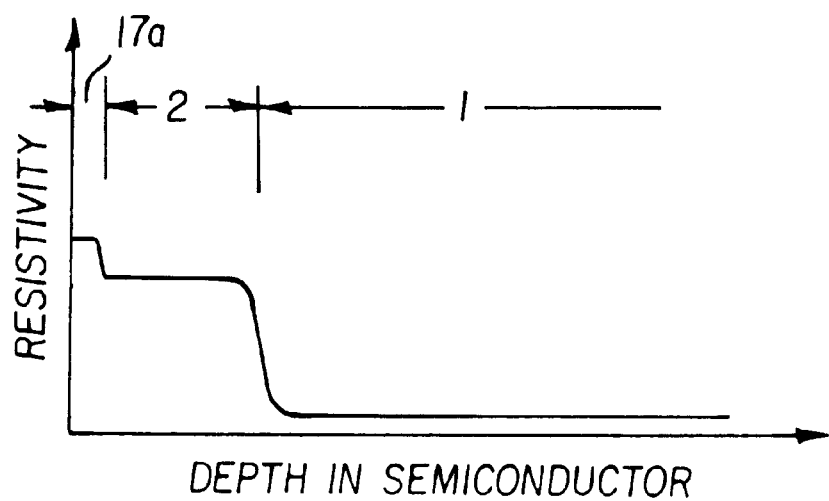
FIG. 11 is a graph showing a profile of the resistivity of the Schottky diode of the sixth embodiment of the invention.

The graph of FIG. 11 shows a profile of the resistivity measured along a cross section of the Schottky diode 206 of FIG. 10. The horizontal axis indicates the depth as measured from the surface of the semiconductor substrate, and the vertical axis indicates the resistivity as plotted on a logarithmic scale. The n⁻ high-resistance region 17a having a depth of 1.5 μm lies at the surface of the semiconductor substrate, and the n drift layer 2 having a thickness of about 6 μm and the n⁺ cathode layer 1 having a low resistivity are present in this order under the n⁻ high-resistance region 17a. Since the n⁻ high-resistance region 17a is laminated by epitaxial growth on the n drift layer 2, this region 17a provides an almost constant resistivity, which is larger than 0.55 Ω·m that is the resistivity of the n drift layer 2.

The Schottky diode 206 fabricated in the method as described above has a reduced leakage current $I_R$, and a low forward voltage $V_F$.

Seventh Embodiment

Figure 13:
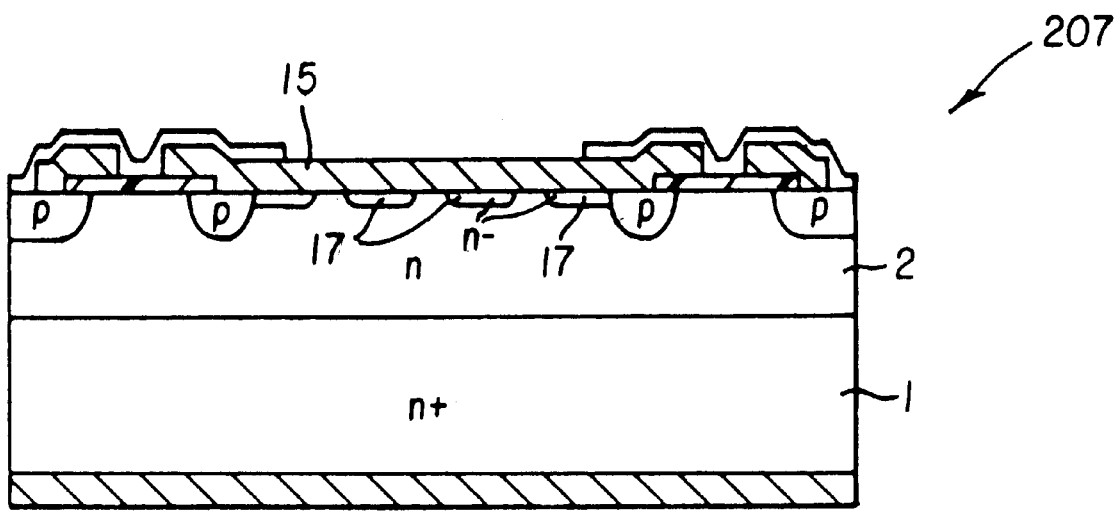
FIG. 13 is a cross-sectional view of a Schottky diode according to the seventh embodiment of the present invention.

FIG. 13 is a cross-sectional view of a Schottky diode 207 constructed according to the seventh embodiment of the present invention. This diode 207 is different from the Schottky diode 205 of FIG. 7 in that n⁻ high-resistance regions 16 are formed in selected areas of a surface layer of the n drift layer 2. In the manufacturing method of FIG. 9, a step of forming and patterning a photoresist or an oxide film is added prior to the step of implanting boron ions for forming the n⁻ high-resistance region 17, so that the n⁻ high-resistance regions 17 are formed in selected regions of the n drift layer 2. The Schottky electrode 15 extends in parallel with the n⁻ high-resistance regions 17 and exposed portions of the n drift layer 2 having a smaller resistivity than these regions 17, to thus form parallel Schottky diodes.

In the present embodiment, the balance of the forward voltage $V_F$ and the leakage current $I_r$ may be suitably adjusted or controlled by changing the area over which the n⁻ high-resistance region 17 is formed.

Eighth Embodiment

Figure 14:
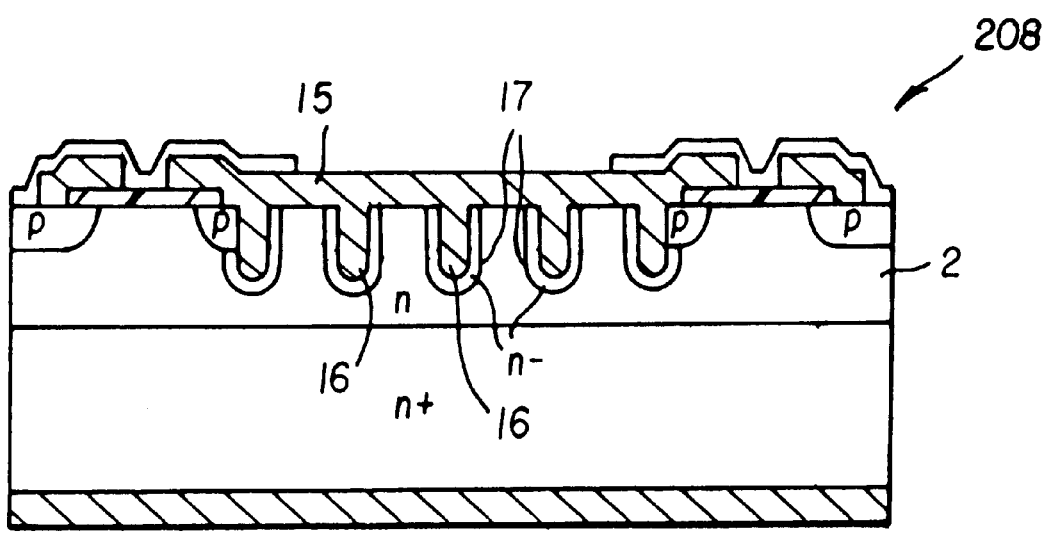
FIG. 14 is a cross-sectional view of a Schottky diode according to the eighth embodiment of the invention.

FIG. 14 is a cross-sectional view of a Schottky diode 208 as the eighth embodiment of the present invention, which is a modified example of the Schottky diode 205 of FIG. 7. In this example, trenches 16 are formed in a surface layer of the n drift layer 2, and an n⁻ high-resistance region 17 is formed on the surface of the n drift layer 2 and the inner faces of the trenches 16, through implantation of boron ions and thermal diffusion. Schottky diode 15 made of molybdenum, for example, is formed in contact with the n⁻ high-resistance region 17. With the trenches 16 thus provided, the contact area of the Schottky electrode 15 is increased, with a result of an increase in the current capacitance.

Ninth Embodiment

Figure 15:
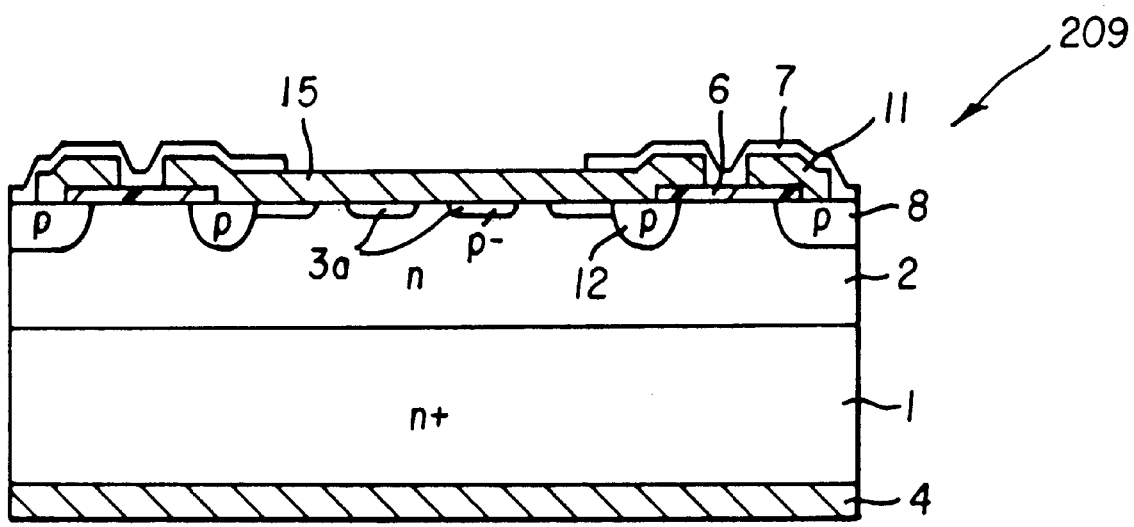
FIG. 15 is a cross-sectional view of a Schottky diode according to the ninth embodiment of the invention.

FIG. 15 is a cross-sectional view of a composite diode 209 of the ninth embodiment of the present invention having pn junction and Schottky junction. A semiconductor substrate consists of a high-concentration n⁺ cathode layer 1 and a low-concentration n drift layer 2, and p⁻ anode regions 3a are formed in selected areas of a surface layer of the n drift layer 2 of the substrate. On the semiconductor substrate is formed a Schottky electrode 15 made of a metal, such as molybdenum, which forms high Schottky junctions or barriers when contacting with exposed portions of the n drift layer 2. Molybdenum is also in ohmic contact with the surfaces of the p⁻ anode regions 3a. Schottky electrodes may be formed on the exposed portions of the n drift layer 2, and a metal that is in ohmic contact with the surfaces of the p⁻ anode regions 4a may be superposed on the Schottky electrodes. A cathode electrode 3 is formed on the rear surface of the n⁺ cathode layer 1. The Schottky diode 209 further includes a ring-shaped p ring region 12, oxide film 6 that covers the surface of the pn junction, and a protective film 7 in the form of a nitride film. A p-type peripheral region 8 is formed in a peripheral portion of the composite diode 209, and a peripheral electrode 11 is formed on the surface of the p peripheral region 8, to extend over a part of the oxide film 6. The p⁻ anode region 3a has substantially the same dimension (depth) and concentration distribution as the p⁻ anode region 3a of the pn diode 201 of the first embodiment.

The composite diode 209 having the pn junction and Schottky junctions can make use of a low forward-voltage characteristic of the Schottky diode in a low current region and that of the pn junction diode in a high current region. During reverse recovery, this composite diode 209 takes advantage of a fast switching characteristic (high switching speed) of the Schottky diode. In the present embodiment, the total amount of impurities contained in the p⁻ anode regions 3a is reduced by about three orders of magnitude, and therefore the amount of minority carriers injected into the n drift layer 2 is considerably reduced, resulting in a further shortened reverse recovery time $t_{rr}$.

In order to control the reverse recovery time $t_{rr}$ to a given value, the composite diode 209 requires a considerably reduced amount of lifetime killers, and thus the leakage current $I_R$ can be significantly reduced. In addition, the reverse recovery waveform exhibits soft recovery.

If the spacing between adjacent ones of the p⁻ anode regions 3a is reduced, depletion layers formed in the regions 3a may connect with each other upon application of reverse bias, resulting in further reduction in the leakage current.

Tenth Embodiment

Figure 16:
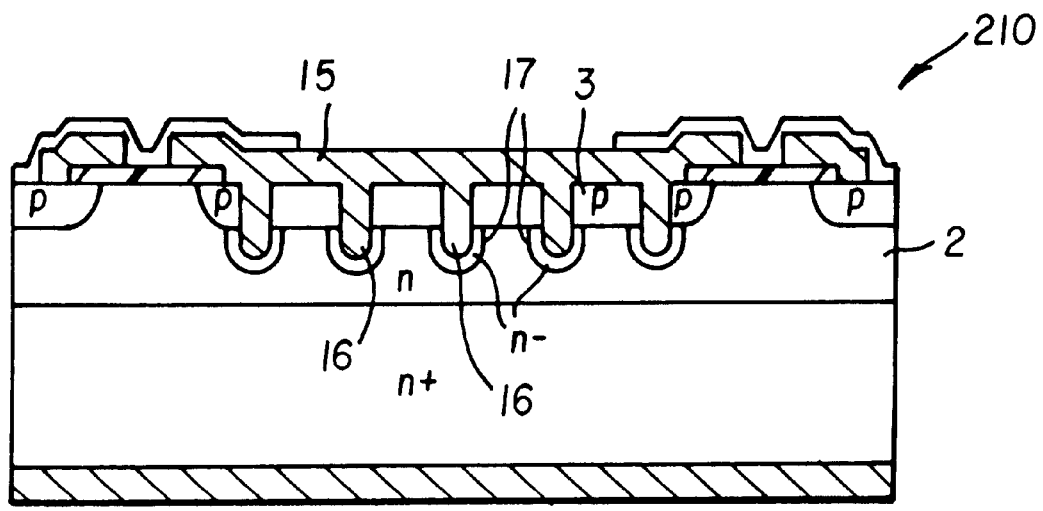
FIG. 16 is a cross-sectional view of a Schottky diode according to the tenth embodiment of the invention.

FIG. 16 is a cross-sectional view of a composite diode 210 of the tenth embodiment of the present invention, which is a slightly modified example of the composite diode 209 of FIG. 15. In this example, a p anode region 3 having a large total amount of impurities is formed in a surface layer of an n drift layer 2, and trenches 16 having a larger depth than the p anode region 3 are formed in the n drift layer 2, through the p anode region 3. Further, n⁻ high-resistance regions 17 having a small diffusion depth are formed on the inner faces of portions of the trenches 16 that have a larger depth than the p anode region 3, as in the fifth embodiment. A Schottky electrode 15 made of a suitable metal is embedded in the trenches 16 such that the metal contacts with the surfaces of the n⁻ high-resistance regions 17 on the inner faces of the trenches 16, so as to form Schottky junctions. The Schottky electrode 15 is also in ohmic contact with the surface of the p anode region 3. Since the resistivity of a contact portion of the Schottky electrode 15 of this diode 210 is higher than that of the known Schottky diode, the leakage current $I_R$ can be reduced, and the resistivity of the n drift layer 2 is kept at a low level, resulting in a reduced forward voltage $V_F$. Moreover, the provision of the trenches 16 leads to an increase in the total area of Schottky junctions formed by the Schottky electrode 15 and the n⁻ high-resistance regions 17 having a small diffusion depth, and an increase in the current capacitance. At the same time, the provision of the p anode region 3 having a large total amount of impurities leads to reduction in the forward voltage in a high current region.

Eleventh Embodiment

Figure 17:
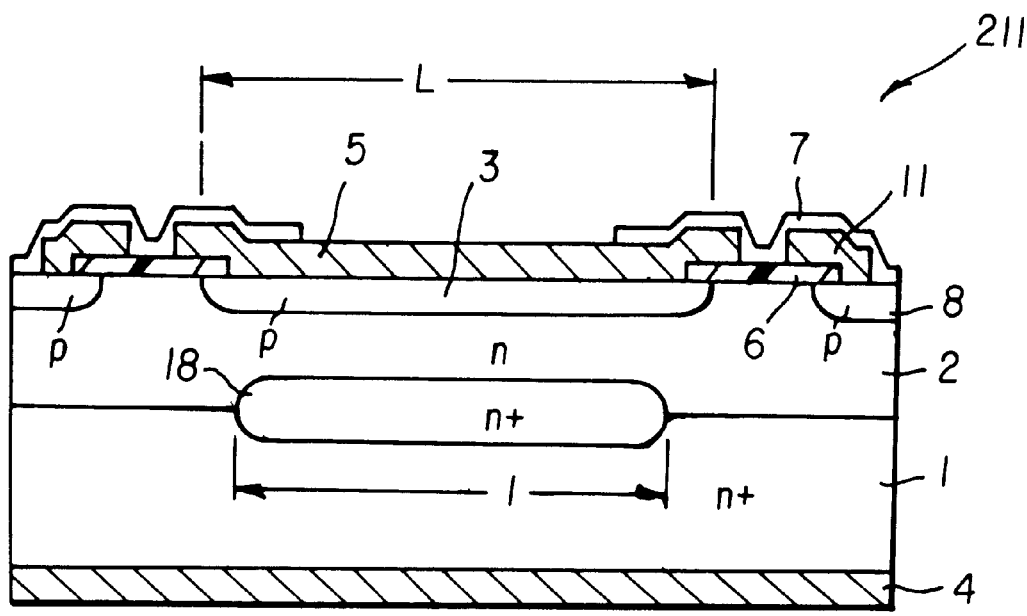
FIG. 17 is a cross-sectional view of a pn junction diode according to the eleventh embodiment of the invention.

FIG. 17 is a cross-sectional view of a pn junction diode 211 constructed according to the eleventh embodiment of the present invention. In this diode 211, an n⁺ embedded region 18 is formed in a part of the interface between a high-concentration n⁺ cathode layer 1 and a low-concentration n drift layer 2, and a p anode region 3 are formed in a selected area of a surface layer of the n drift layer 2 above the n⁺ embedded region 18. What is important in this embodiment is that the width L of the p anode region 3 is larger than the width I of the n⁺ embedded region 18. Anode electrode 5 and cathode electrode 4 are formed in contact with the surface of the p anode region 3 and the rear surface of an n⁺ cathode layer 1, respectively. The diode 211 further includes an oxide film 6 that covers the surface of the pn junction, and a protective film 7 in the form of a nitride film. A p peripheral region 8 is formed in a peripheral portion of the pn diode 211, and a peripheral electrode 11 is formed on the surface of the p peripheral region 8. The peripheral electrode 11 also extends over a part of the oxide film 6.

Figure 19A:
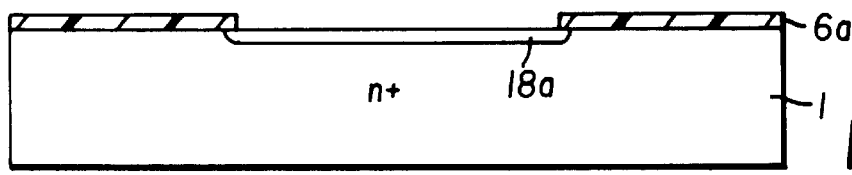
FIG. 19(a) through FIG. 19(e) are cross-sectional views showing main process steps of a method for manufacturing the pn junction diode of the eleventh embodiment.

FIG. 19(a) through FIG. 19(d) are cross-sectional views showing main process steps of a method for manufacturing the pn junction diode 211 of the eleventh embodiment. A substrate that has a resistivity of 0.004 Ω·cm and a thickness of 350 μm and provides the n⁺ cathode layer 1 is thermally oxidized, so that an oxide film 6a is grown on the substrate. Then, the oxide film 6a is patterned by photolithography, and phosphorous ions for forming the n⁺ embedded region 18 are implanted in the substrate, as shown in FIG. 19(a). Reference numeral 18a denotes an ion implantation layer. The acceleration voltage during ion implantation is 45 keV, and the dose amount is 5×10¹⁴ cm⁻².

Figure 19B:
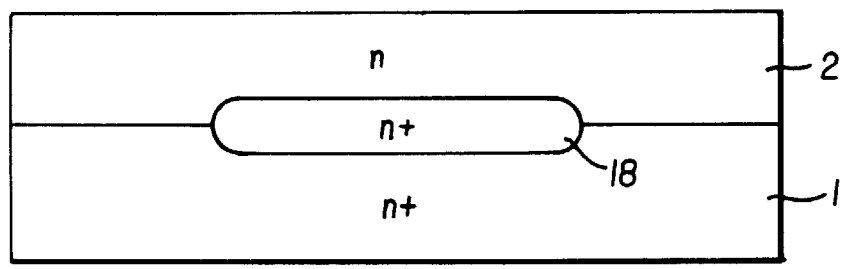

Subsequently, the oxide film 6a is removed, and the n drift layer 2 is laminated by epitaxial growth on the n⁺ cathode layer 1 and the ion implantation layer 18a, and heat-treated, thereby to form the n⁺ embedded region 18, as shown in FIG. 19(b). The n drift layer 2 has a resistivity of 40 Ω·m and a thickness of 60 μm.

Figure 19C:
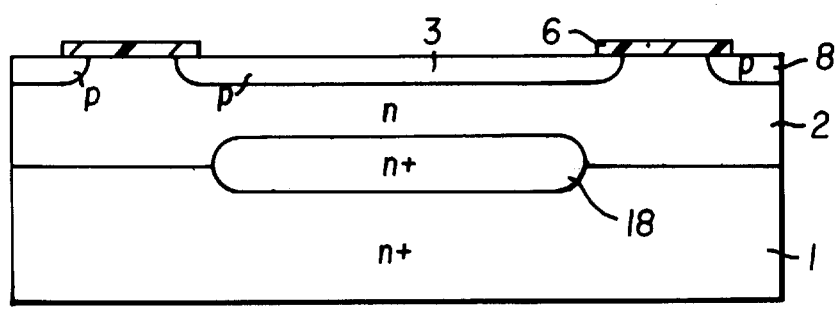

The oxide film 6 is formed by thermally oxidizing the epitaxial wafer thus formed, and patterned by photolithography to provide a mask, and the p anode region 3 and p peripheral region 8 are formed in a surface layer of the n drift layer 2, using the mask, through implantation of boron ions and thermal diffusion, as shown in FIG. 19(c). The acceleration voltage for ion implantation is 45 keV, and the dose amount is 5×10¹⁴ cm⁻². After the ion implantation, annealing is conducted at 1150° C. for 200 min. The surface impurity concentration of the p anode region 3 and p peripheral region 8 is about 1×10¹⁹ cm⁻³, and the diffusion depth is 3 μm.

Figure 19D:
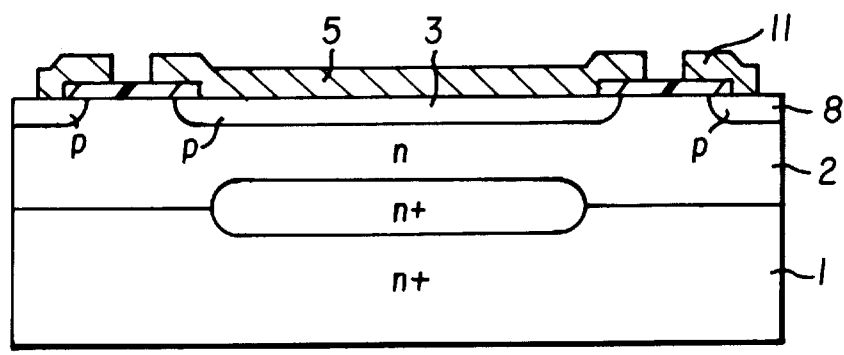

A 5 μm-thickness aluminum alloy is deposited by sputtering on the surface of the structure shown in FIG. 19(c), and patterned by photolithography to thus form the anode electrode 5 and peripheral electrode 11, as shown in FIG. 19(d).

Figure 19E:
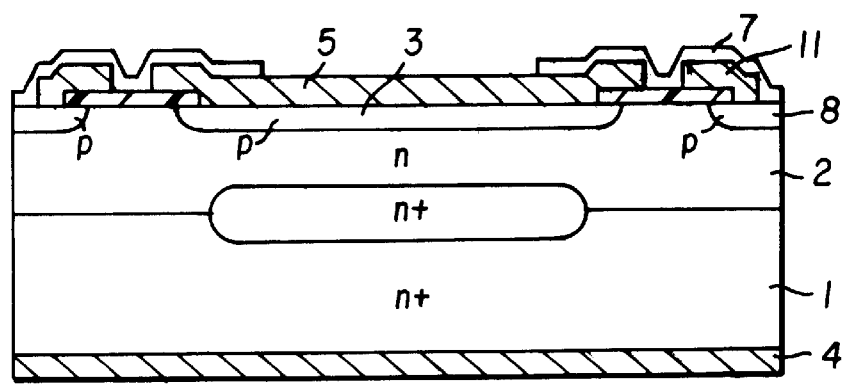

Subsequently, a nitride film is deposited by a plasma CVD method, and patterned by photolithography, to provide the protective film 7, and three layers of titanium, nickel and gold are vapor-deposited on the rear surface of the n⁺ cathode layer 1, to thus form the cathode electrode 4, as shown in FIG. 19(e).

Figure 20A:
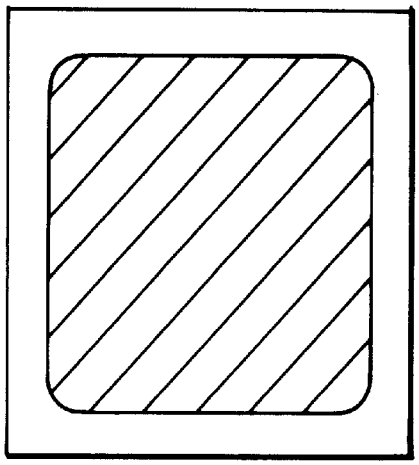
FIG. 20 is a view showing a mask used for forming an n$^+$ embedded layer of the pn junction diode of the eleventh embodiment.
Figure 20B:
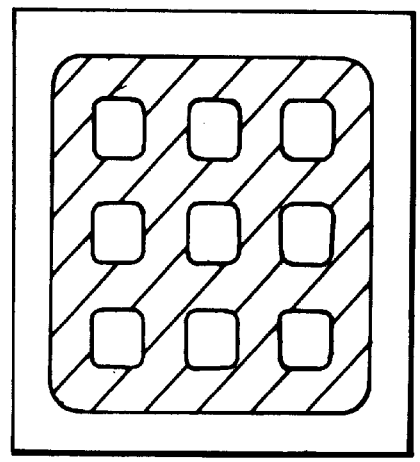
Figure 20C:
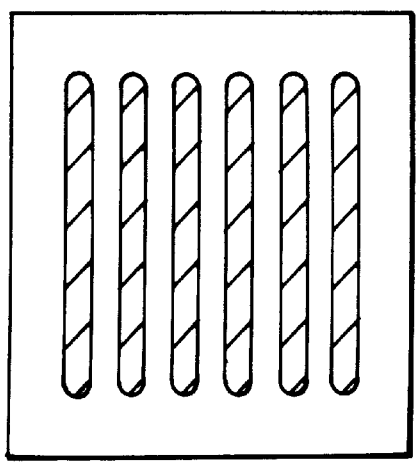
Figure 20D:
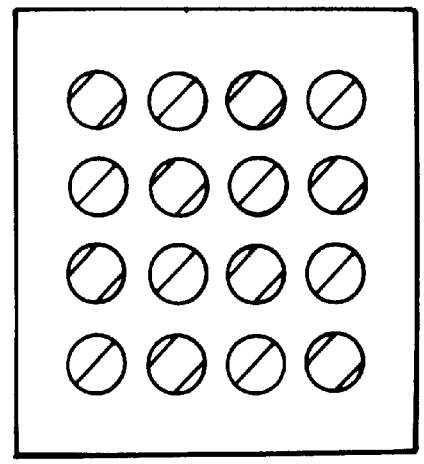

FIG. 20(a) shows an example of a photomask used for forming the n+ embedded region. The n+ embedded region having a rectangular shape is formed in the hatched portion in FIG. 20(a). Another example of photomask is shown in FIG. 20(b) which is used for forming a lattice-shaped n+ embedded region, and other examples of photomasks are shown in FIG. 20(c) and FIG. 20(d) which are used for forming spaced n+ embedded regions.

Figure 18:
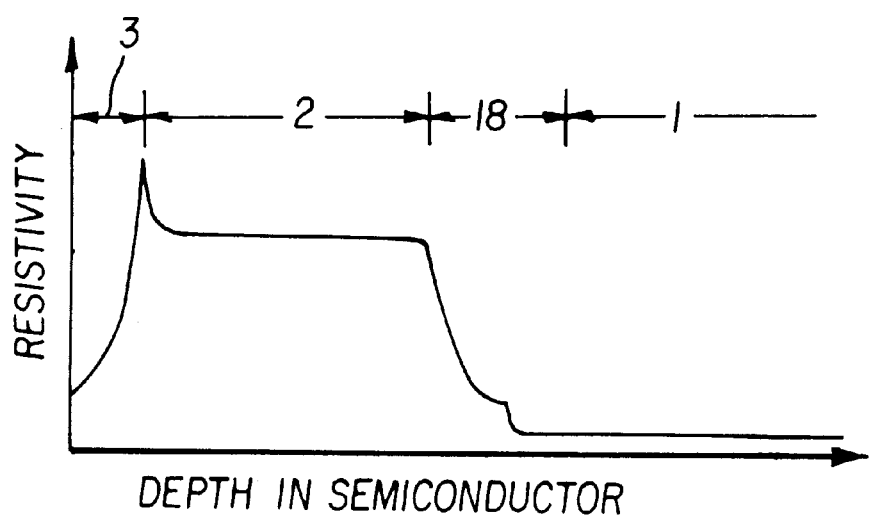
FIG. 18 is a graph showing a profile of the resistivity of the pn junction diode of the eleventh embodiment.

The graph of FIG. 18 shows a profile of the resistivity measured along a cross section of the pn junction diode 211 of FIG. 17. The horizontal axis indicates the depth as measured from the surface of the semiconductor substrate, and the vertical axis indicates the resistivity as plotted on a logarithmic scale. The p anode region 3 having a depth of 0.3 $\mu$m lies at the surface of the semiconductor substrate, and the n drift layer 2 having a thickness of about 53 $\mu$m, and the n+ embedded region and n+ cathode layer 1 each having a low resistivity are present in this order under the p anode region 3.

In the pn junction diode 211 of the eleventh embodiment, the width L of the p anode region 3 is larger than the width I of the n+ embedded region 18. When a reverse bias is applied to this diode, therefore, a depletion layer that spreads from the pn junction between the p anode region 3 and the n drift layer 2 initially hits the n+ embedded region 18. Accordingly, the avalanche breakdown does not occur at a portion of the p anode region 2 having a certain radius of curvature, or its corner portion, but occurs uniformly in a small-thickness region of the n drift layer 2. Thus, the breakdown takes place occurs at the same time over a broad area or region, and therefore the diode has an increased avalanche current.

For example, a 3 mm-square diode having a rated voltage of 600V, which is constructed according to the eleventh embodiment, has an avalanche current of 100 A, which is at least 10 times greater than that of the known diode.

Twelfth Embodiment

Figure 21A:
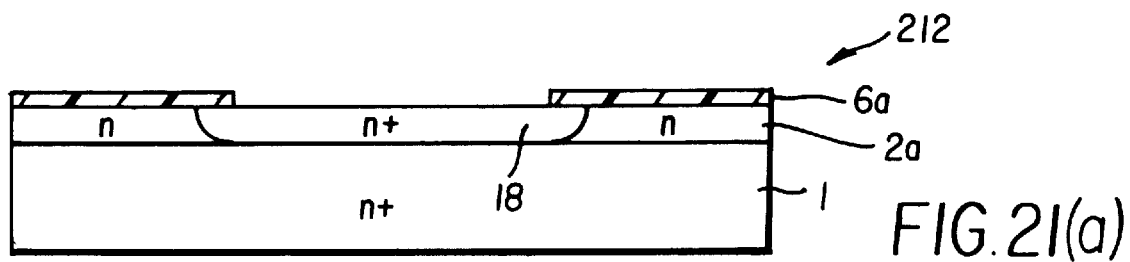
FIG. 21(a) through FIG. 21(d) are cross-sectional views showing main process steps of a method for forming a pn junction diode according to the twelfth embodiment of the invention.

FIG. 21(a) through FIG. 21(d) are cross-sectional views showing main process steps of a method for manufacturing a n junction diode 212 according to the twelfth embodiment of the present invention. Initially an n drift layer 2a having a resistivity of 40 $\Omega \cdot$m and a thickness of 10 $\mu$m is formed by epitaxial growth on a substrate which provides an n+ cathode layer 1. The substrate is doped with phosphorous ions, and has a resistivity of 0.004 $\Omega \cdot$cm and a thickness of 350 $\mu$m. The epitaxial wafer thus formed is thermally oxidized, so that an oxide film 6a is grown on the wafer. Then, the oxide film 6a is patterned by photolithography, and antimony ions for forming an n+ embedded region are implanted, and heat-treated, to thus form an n+ embedded region 18, as shown in FIG. 21(a). The acceleration voltage for ion implantation is 45 keV, and the dose amount is $5 \times 10^{14}$ cm$^{-2}$. The heat treatment is conducted at 1150° C. for 300 min.

Figure 21B:
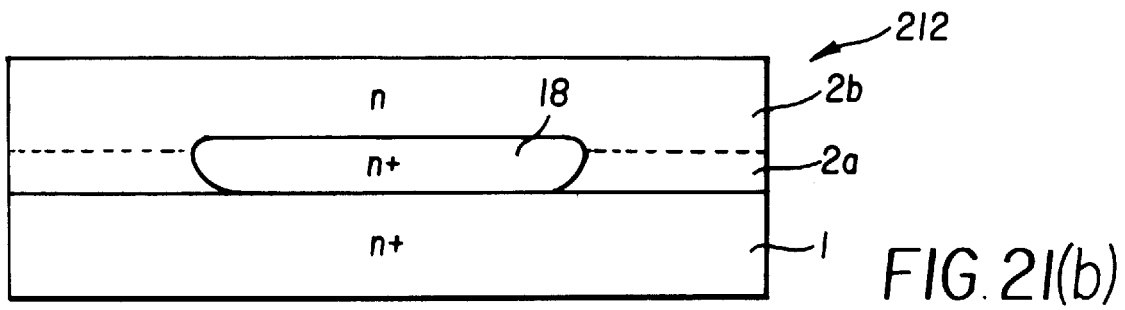

Subsequently, the oxide film 6a is removed, and an n drift layer 2b having a resistivity of 40 $\Omega \cdot$cm is laminated by epitaxial growth with an addition thickness of 50 $\mu$m, as shown in FIG. 21(b). The total thickness of the n drift layer 20 is 60 $\mu$m when measured at its thin portion, and 70 $\mu$m when measured at its thick portion.

Figure 21C:
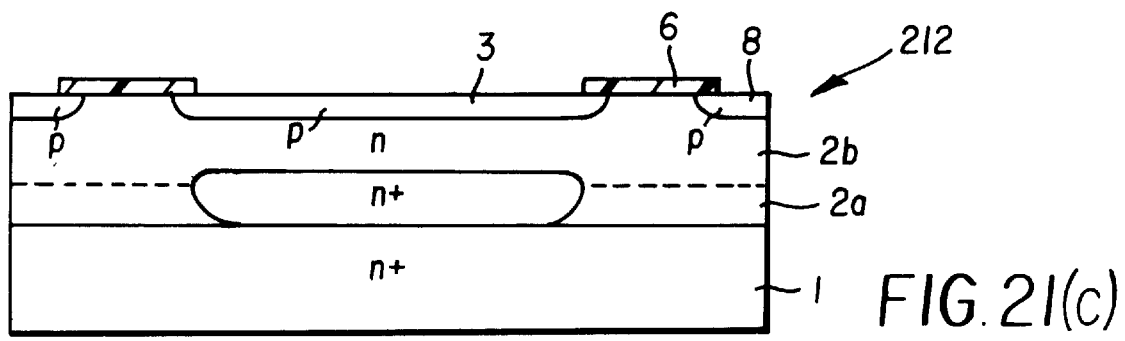

An oxide film 6 is formed by thermally oxidizing the epitaxial wafer thus formed, and patterned by photolithography, to provide a mask, and a p anode region 3 and a p peripheral region 8 are formed in a surface layer of the n drift layer 2b, using the mask, through implantation of boron ions and thermal diffusion, as shown in FIG. 21(c). The acceleration voltage for ion implantation is 45 keV, and the dose amount is $5 \times 10^{13}$ cm$^{-2}$. After the ion implantation, annealing is conducted at 1150° C. for 200 min. The surface impurity concentration of the p anode region 3 and p peripheral region 8 is about $1 \times 10^{17}$ cm$^{-3}$, and the diffusion depth of these regions is 3 $\mu$m.

Figure 21D:
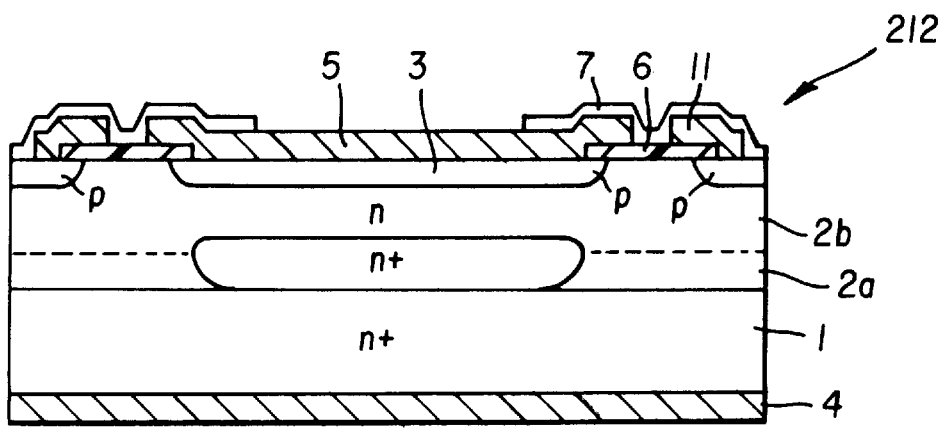

Thereafter, anode electrode 5, peripheral electrode 11, cathode electrode 4 and protective film 7 are formed in the same manner as in the eleventh embodiment, to provide a structure as shown in FIG. 21(d).

According to the manufacturing method as described above, the n+ embedded region 18a having a large thickness can be easily formed, and its thickness can be easily controlled. Another advantage of this method is that the n drift layer 2 is heat-treated to a reduced degree.

In this embodiment, too, the width of the p anode region 3 is larger than the width of the n+ embedded region 18a. Accordingly, the avalanche breakdown of the pn junction between the p anode region 3 and the n drift layer 2 occurs at a small-thickness region of the n drift region 2, and thus the avalanche current of the diode can be increased.

Thirteenth Embodiment

Figure 22:
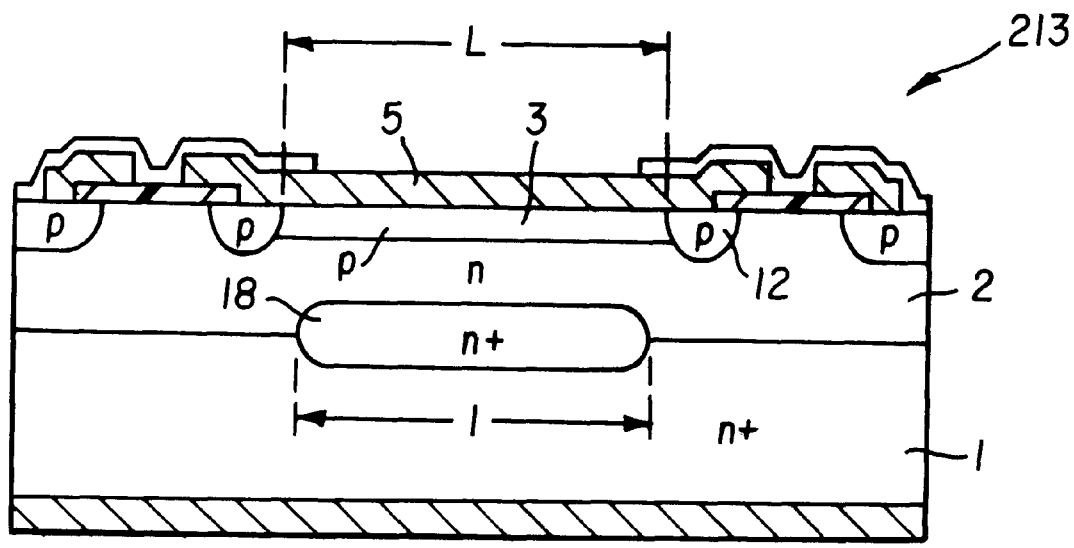
FIG. 22 is a cross-sectional view of a pn junction diode according to the thirteenth embodiment of the present invention.

FIG. 22 is a cross-sectional view of a pn junction diode 213 constructed according to the thirteenth embodiment of the present invention. As in the eleventh embodiment, an n+ embedded region 18 is formed in a part of the interface between a high-concentration n+ cathode layer 1 and a low-concentration n drift layer 2. A p ring region 12 is formed in a surface layer of the n drift layer 2 above the n+ embedded region 18, and a p anode region 3 having a smaller diffusion depth than the p ring region 12 is formed inside the p ring region 12. For example, when the diffusion depth of the p ring region 12 is 5 $\mu$m, the diffusion length of the p anode region is controlled to 3 $\mu$m. In this embodiment, it is considered important that the spacing L between opposite portions of the p ring region 12 is set to be larger than the width I of the n+ embedded region 18, and that the thickness of the n drift layer 2 between the p anode region 3 and the n+ embedded region 18 is smaller than that of the n drift layer 2 located below the p ring region 12.

With this arrangement, when a reverse-bias voltage is applied, a depletion layer that extends from the p anode region 3 reaches the n+ embedded region 18 before a depletion layer that extends from the p ring region 12 reaches the n+ cathode region 1. As a result, breakdown occurs uniformly in a small-thickness region of the n drift layer 2, and thus the avalanche current of the diode 213 can be increased.

Fourteenth Embodiment

Figure 23:
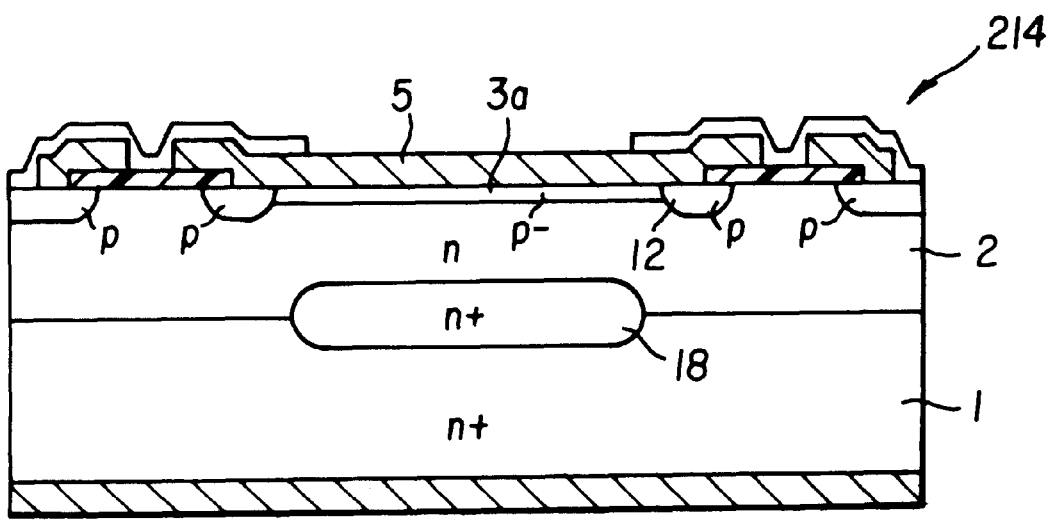
FIG. 23 is a cross-sectional view of a pn junction diode according to the fourteenth embodiment of the invention.

FIG. 23 is a cross-sectional view of a pn junction diode 214 constructed according to the fourteenth embodiment of the present invention. As in the twelfth embodiment, an n+ embedded region 18 is formed in a part of the interface between a high-concentration n+ cathode layer 1 and a low-concentration n drift layer 1, and a p ring region 12 is formed in a surface layer of the n drift layer 2. In the present embodiment, a p$^-$ anode region 3a similar to that of the first embodiment, which has a small total amount of impurities and a small diffusion depth, is formed inside the p ring region 12. For example, the dose amount of boron ions when forming the p$^-$ anode region 3a is $1 \times 10^{12}$ cm$^{-2}$, and the depth of the pn junction between the p$^-$ anode region 3a and the n drift layer 2 is 0.3 $\mu$m. It is considered important that the spacing between opposite portions of the p ring region 12 is larger than the width of the n⁺ embedded region 18, and that the thickness of the n drift layer 2 between the p⁻ anode region 3a and the n⁺ embedded region 18 is smaller than that of the n drift layer 2 located below the p ring region 18.

In this embodiment, too, breakdown of the pn junction between the p⁻ anode region 3a and the n drift layer 2 occurs uniformly in a small-thickness region of the n drift layer 2, which leads to an increased avalanche current of the diode 214, as in the thirteenth embodiment. Further, as in the first embodiment, the total amount of impurities contained in the p⁻ anode region 3a is reduced by about three orders of magnitude as compared with that of the known pn junction diode, whereby the amount of minority carriers injected into the n drift layer 2 is considerably reduced, and the reverse recovery time $t_{rr}$ is accordingly shortened.

In order to control the reverse recovery time $t_{rr}$ to a given value, lifetime killers may be significantly reduced as compared with those of the known diode, and therefore the leakage current $I_R$ can be greatly reduced. In addition, the reverse recovery waveform exhibits soft recovery owing to increased lifetime in the n drift layer 2.

Fifteenth Embodiment

Figure 24:
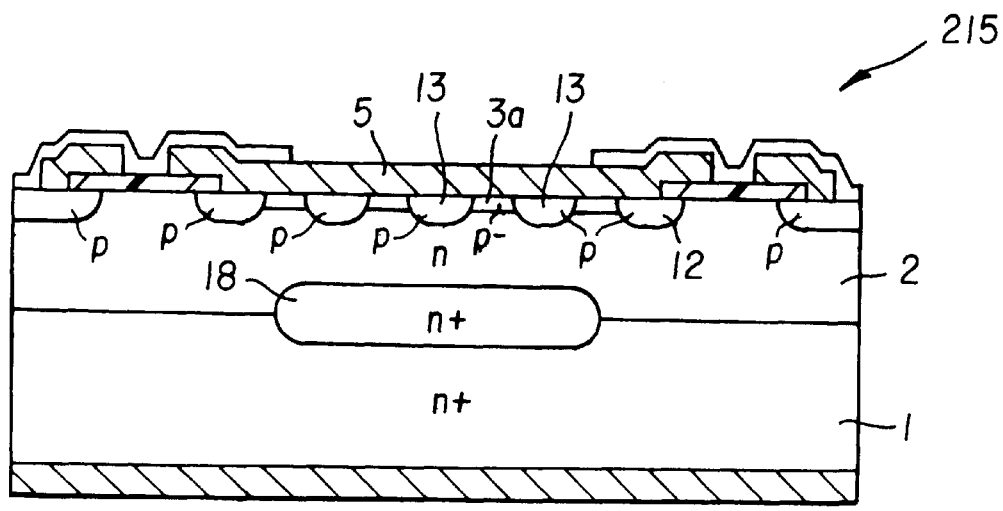
FIG. 24 is a cross-sectional view of a pn junction diode according to the fifteenth embodiment of the invention.

FIG. 24 is a cross-sectional view of a pn junction diode 215 constructed according to the fifteenth embodiment of the present invention. As in the twelfth embodiment, an n⁺ embedded region 18 is formed in a part of the interface between a high-concentration n⁺ cathode layer 1 and a low-concentration n drift layer 1, and a p ring region 12 is formed in a surface layer of the n drift layer 2. In the present embodiment, a p⁻ anode region 3a similar to that of the fourteenth embodiment, which has a low surface impurity concentration and a small diffusion depth, is formed inside the p ring region 12. Further, p high-concentration regions 13 having a high surface concentration and a large diffusion depth are formed between spaced portions of the p⁻ anode region 3a. When rated current is applied to this diode 215, the current flows through the p³¹ anode region 3a, assuring an excellent reverse recovery characteristic. When a reverse bias is applied, a depletion layer extends from the p high-concentration region 13, and thus the resulting diode has a high breakdown voltage.

In the pn junction diode 12, the spacing between opposite portions of the p ring region 12 is larger than the width of the n⁺ embedded region 18, and the thickness of the n drift layer 2 between the p high-concentration region 13 and the n⁺ embedded region 18 is smaller than the thickness of the n drift layer 2 located below the p ring region 12. When a reverse-bias voltage is applied, therefore, the breakdown occurs at the same time at a region inside the p ring region 12. Thus, the diode 215 has an increased avalanche current. The p high-concentration regions 13 may be formed in the shape of stripes, lattice, or dots.

Sixteenth Embodiment

Figure 25:
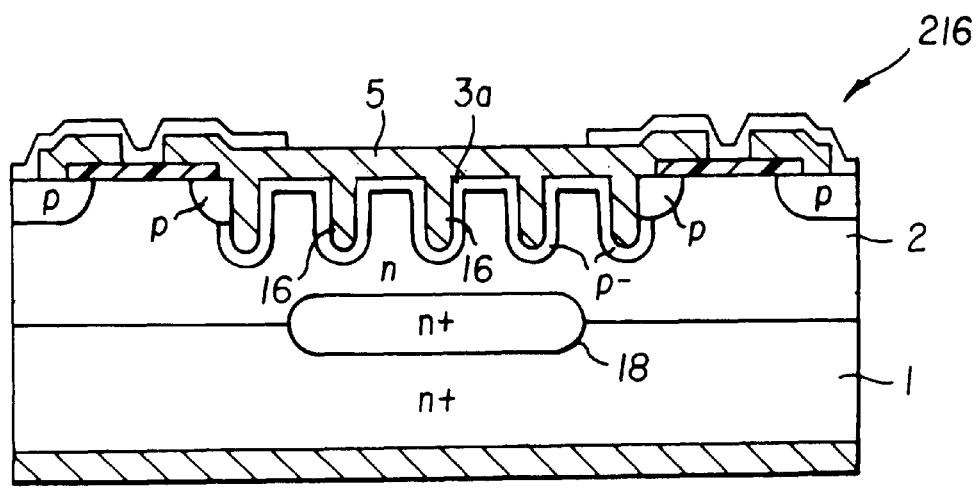
FIG. 25 is a cross-sectional view of a pn junction diode according to the sixteenth embodiment of the invention.

FIG. 25 is a cross-sectional view of a pn junction diode 216 constructed according to the sixteenth embodiment of the present invention. An n⁺ embedded region 18 is formed in a part of the interface between a high-concentration n⁺ cathode layer 1 and a low-concentration n drift layer 1, and trenches 16 are formed in a surface layer of the n drift layer 2. A p³¹ anode region 3a similar to that of the first embodiment, which has a small total amount of impurities and a small diffusion depth, is formed along the surface of the n drift layer 2 and inner faces of the trenches 16, and an anode electrode 5 is formed in contact with the p⁻ anode region 3a. Namely, the diode 216 of the present embodiment is obtained by adding the n⁺ embedded region 18 to the pn junction diode of the fifth embodiment. The spacing between the outermost trenches 16 is made larger than the width of the n⁺ embedded region 18.

In a conventional diode provided with trenches, concentration of the electric field takes place at a portion where the outermost trenches are located, resulting in a reduced breakdown voltage. This is because each trench located inside the outermost trenches faces two trenches on the opposite sides thereof, whereas each of the outermost trenches faces only one trench located on one of the opposite sides thereof.

In the present embodiment in which the concentration of the electric field at the outermost trenches is avoided, when a reverse-bias voltage is applied, the breakdown of the pn junction between the p⁻ anode region 3a and the n drift layer 2 occurs at the same time at the trenches 18 located inside the outermost trenches, and thus the avalanche current is increased. Further, as in the first embodiment, the total amount of impurities contained in the p⁻ anode region 3a is reduced by about three orders of magnitude, as compared with that of the known pn junction diode, and therefore the amount of minority carriers injected into the n drift layer 2 is remarkably reduced, with a result of reduction in the reverse recovery time $t_{rr}$. In addition, the provision of the trenches 16 lead to an increase in the contact area of the pn junction, and an increase in the current capacitance.

The trenches 16 may be formed in the shape of stripes or lattice.

Seventeenth Embodiment

Figure 26:
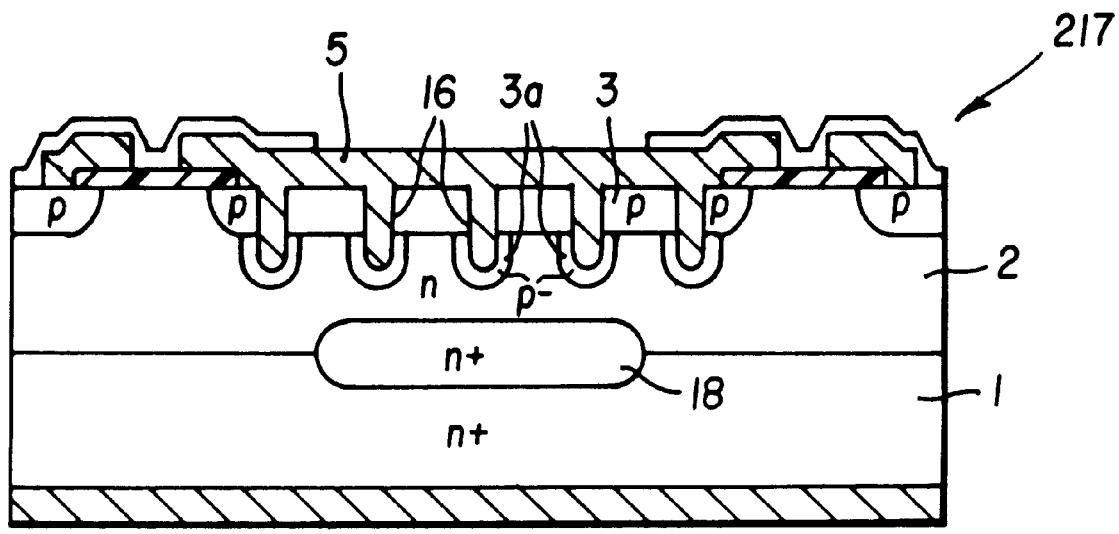
FIG. 26 is a cross-sectional view of a pn junction diode according to the seventeenth embodiment of the invention.

FIG. 26 is a cross-sectional view of a pn junction diode 217 constructed according to the seventeenth embodiment of the present invention. An n⁺ embedded region 18 is formed in a part of the interface between a high-concentration n⁺ cathode layer 1 and a low-concentration n drift layer 2, and a p anode region 3 having a large total amount of impurities is formed in a surface layer of the n drift layer 2. Further, trenches 16 having a larger depth than the p anode region 3 are formed in the n drift layer 2, through the p anode region 3, and p⁻ anode regions 3a similar to that of the first embodiment are formed on the inner faces of portions of the trenches 16 which are deeper than the p anode region 3. The total amount of impurities in the p⁻ anode region 3a is smaller by some orders of magnitude than that of the known diode, and this region 3a has a relatively small diffusion depth. Namely, the pn junction diode 217 of this embodiment is obtained by adding the n⁺ embedded region 18 to the pn junction diode of the fourth embodiment shown in FIG. 6. The width or spacing between the outermost trenches is larger than the width of the n⁺ embedded region 18.

In the present embodiment, too, when a reverse-bias voltage is applied, the breakdown occurs at the same time at a portion of the n drift layer 2 below the inner trenches 16 located inside the p ring region 12, and thus the avalanche current is increased. With the p⁻ anode region 3a and p anode region 3 thus provided, the forward voltage can be reduced in a low current region and a high current region, and the switching time can be shortened. Also, the provision of the trenches 15 leads to an increase in the contact area of the p⁻ anode region 3a having a small diffusion depth, and an increase in the current capacitance.

Eighteenth Embodiment

Figure 27:
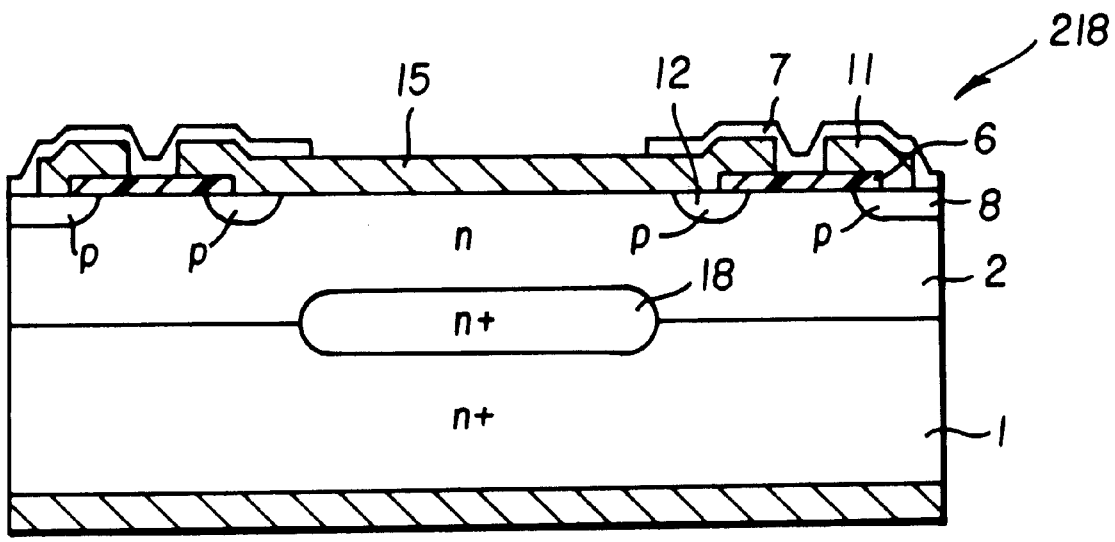
FIG. 27 is a cross-sectional view of a Schottky diode according to the eighteenth embodiment of the invention.

FIG. 27 is a cross-sectional view of a Schottky diode 218 constructed according to the eighteenth embodiment. An n⁺ embedded region 18 is formed in a part of the interface between a high-concentration n⁺ cathode layer 1 and a low-concentration n drift layer 2, and a p ring region 12 is formed in a surface layer of the n drift layer 2. A Schottky electrode 15 is provided which contacts with the surface of the n drift layer 2 inside the p ring region 12, to form a Schottky junction.

Figure 41:
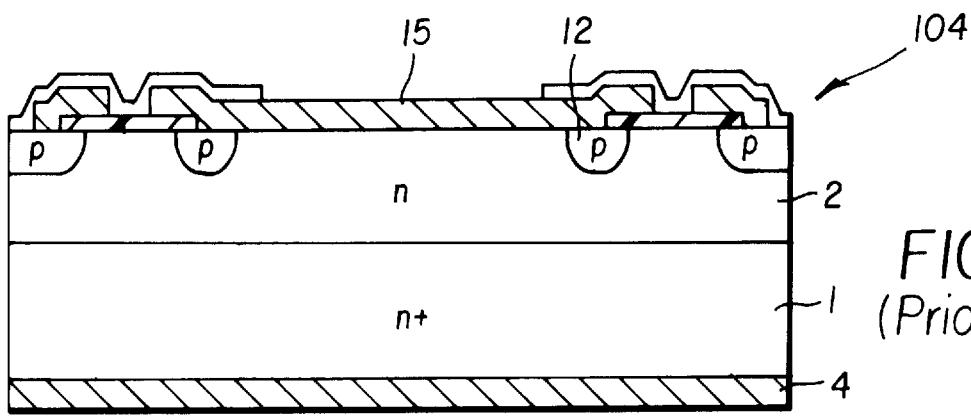
FIG. 41 is a cross-sectional view of a known example of Schottky diode.

The n drift layer 2 has a resistivity of 0.9 Ω·m and a thickness of 7 μm. The Schottky electrode 15 is formed of molybdenum, for example. Namely, the Schottky diode 218 of the present embodiment is obtained by adding the n⁺ embedded region 18 to the known Schottky diode of FIG. 41. The width of the n drift layer 2 between opposite portions of the p ring region 12 is larger than the width of the n⁺ embedded region 18, and the thickness of the n drift layer 2 located on the n⁺ embedded region 18 is smaller than that of the n drift layer 2 under the p ring region 12.

In this arrangement, when a reverse bias is applied, a depletion layer initially reaches the n⁺ embedded region 18, and the breakdown occurs uniformly in a small-thickness wide region of the n drift layer 2. Thus, the avalanche current of the diode can be increased.

For example, a 3 mm-square diode having a rated voltage of 60V, which is constructed according to the eighteenth embodiment, has an avalanche current of 60 A, which is at least 10 times greater than that of the known diode.

Nineteenth Embodiment

Figure 28:
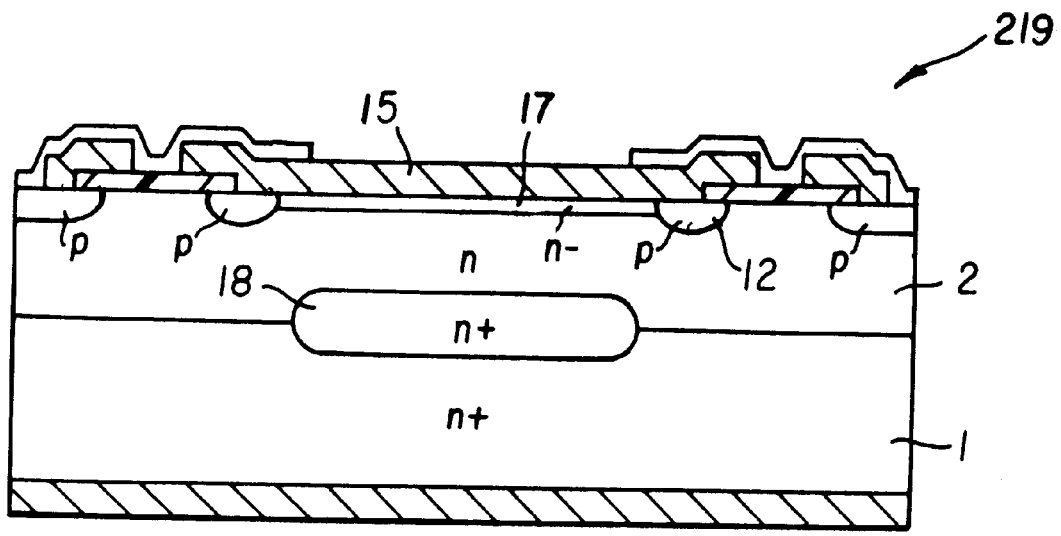
FIG. 28 is a cross-sectional view of a Schottky diode according to the nineteenth embodiment of the invention.

FIG. 28 is a cross-sectional view of a Schottky diode 219 constructed according to the nineteenth embodiment of the present invention. A n⁺ embedded region 18 is formed in a part of the interface between a high-concentration n⁺ cathode layer 1 and a low-concentration n drift layer 2, and a p ring region 12 is formed in a surface layer of the n drift layer 2. An n⁻ high-resistance region 17 having a very small thickness is also formed in the surface layer of the n drift layer 2 inside the p ring region 12, and a Schottky electrode 15 is formed in contact with the n⁻ high-resistance region 17 and the p ring region 12.

The n drift layer 2 has a resistivity of 0.55 Ω·cm, and a thickness of 7 μm. The n⁻ high-resistance region 17 is formed by implantation of boron ions, and has the highest resistivity of about 2 Ω·cm, and a thickness of 0.5 μm. The Schottky electrode 15 is formed of molybdenum. Namely, the Schottky diode 219 of the present embodiment is obtained by adding the n⁺ embedded region 18 to the Schottky diode of fifth embodiment shown in FIG. 7. The spacing between opposite portions of the p ring region 12 is larger than the width of the n⁺ embedded region 18. The thickness of the n drift layer 2 located above the n⁺ embedded region 18 is smaller than that of the n drift layer 2 under the p ring region 12.

Accordingly, as in the Schottky diode of the fifth embodiment, a portion of this diode 219 (corresponding to the n⁻ high-resistance portion 17) which contacts with the Schottky electrode 15 has a higher resistivity than that of the known Schottky diode, and the leakage current $I_R$ is reduced to about one half, assuring an equivalent forward voltage. Further, when a reverse bias is applied, a deletion layer initially reaches the n⁺ embedded region 18, and therefore the breakdown occurs uniformly in a small-thickness region of the n drift layer 2. Thus, the avalanche current of the present diode is increased.

Twentieth Embodiment

Figure 29:
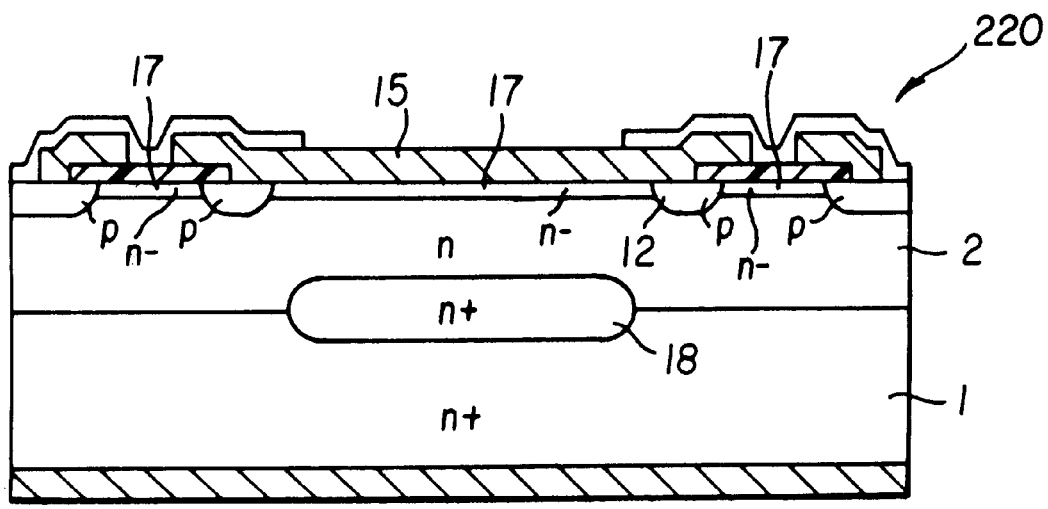
FIG. 29 is a cross-sectional view of a Schottky diode according to the twentieth embodiment of the invention.

FIG. 29 is a cross-sectional view of a Schottky diode 220 constructed according to the twentieth embodiment of the present invention. In this embodiment, an n⁺ embedded region 18 formed in a part of the interface between a high-concentration n⁺ cathode layer 1 and a low-concentration n drift layer 2, and a p ring region 12 is formed in a surface layer of the n drift layer 2. An n⁻ high-resistance region 17 having a very small thickness is also formed in the surface layer of the n drift layer 2 inside the p ring region 12, and a Schottky electrode 15 is formed in contact with the n⁻ high-resistance region 17 and the p ring region 12. The Schottky diode 220 of the present embodiment is different from the Schottky diode 219 of the nineteenth embodiment in that the n⁻ high resistance region 17 having a low concentration is formed by epitaxial growth, to extend over the surface of the n drift layer 2 outside the p ring region 12. The n drift layer 2 has a resistivity of 0.55 Ω·cm, and a thickness of 6 μm, and the n high-resistance region 17 is has a resistivity of 0.9 Ω·cm, and a thickness of 1 μm. The Schottky electrode 15 is formed of molybdenum.

Accordingly, like the Schottky diode 219 of the nineteenth embodiment, the Schottky diode 220 has a reduced leakage current $I_R$ and a large avalanche current.

Twenty-first Embodiment

Figure 30:
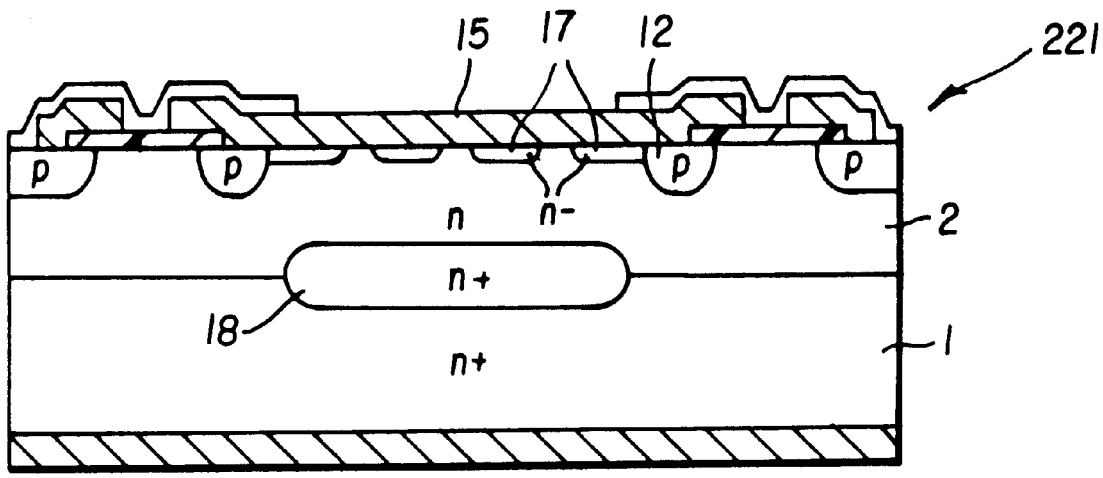
FIG. 30 is a cross-sectional view of a Schottky diode according to the twenty-first embodiment of the invention.

FIG. 30 is a cross sectional view of a Schottky diode 221 constructed according to the twenty-first embodiment of the present invention, which is a modified example of the Schottky diode 219 of the nineteenth embodiment. In this example, n⁻ high-resistance regions 17 having a very small thickness are formed in selected areas of a surface layer of the n drift layer 2 inside the p ring region 12. In a method of fabricating this diode 221, a step of patterning a photoresist or oxide film to provide a mask is added prior to the step of implanting boron ions to form the n⁻ high-resistance region 7, so that the ions are implanted in selected areas defined by the mask. The spacing between opposite portions of the p ring region 12 is larger than the width of the n⁺ embedded region 18. The thickness of the n drift layer 2 located on the n⁺ embedded region 18 is smaller than the thickness of the n drift layer under the p ring region 12.

Namely, the Schottky diode 221 of the present embodiment is obtained by adding the n⁺ embedded region 18 to the Schottky diode 207 of the seventh embodiment shown in FIG. 13. Accordingly, in addition to the effects of the Schottky diode of the seventh embodiment as described above, the breakdown occurs uniformly in a small-thickness region of the n drift layer 2, and therefore the avalanche current is increased.

Twenty-second Embodiment

Figure 31:
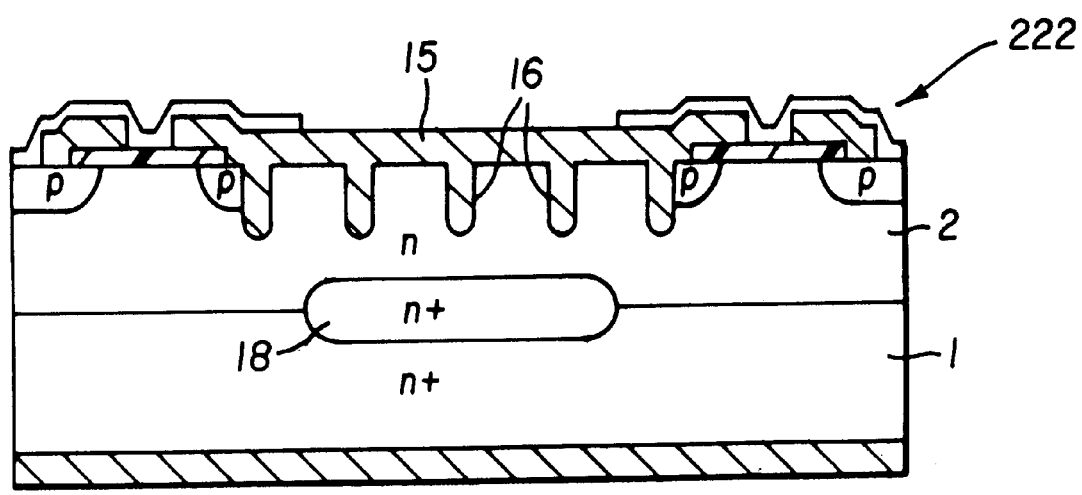
FIG. 31 is a cross-sectional view of a Schottky diode according to the twenty-second embodiment of the invention.
Figure 42:
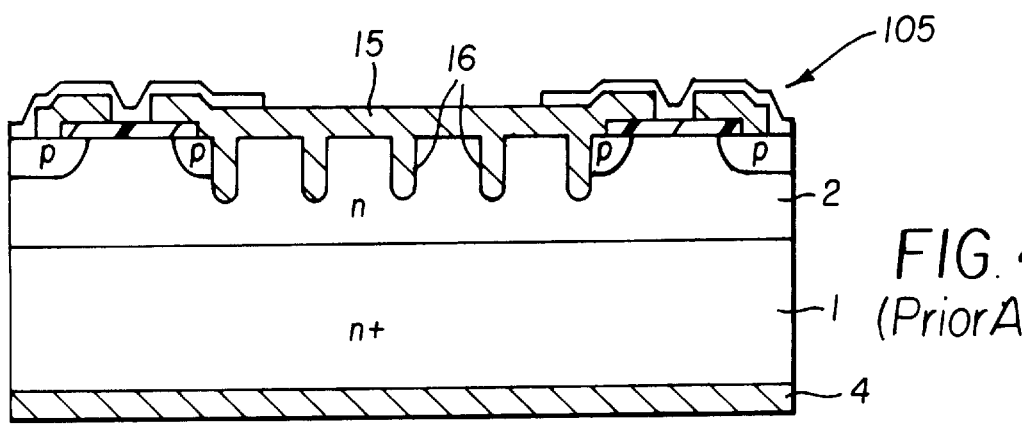
FIG. 42 is a cross-sectional view of another known example of Schottky diode.
Figure 43:
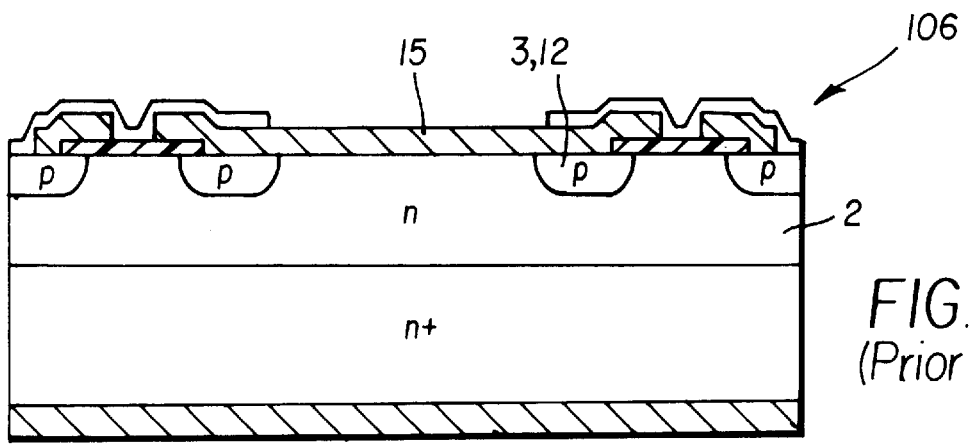
FIG. 43 is a cross-sectional view of a known example of composite diode.

FIG. 31 is a cross-sectional view of a Schottky diode 222 constructed according to the twenty-second embodiment of the present invention. The Schottky diode 222 of this embodiment is obtained by adding an n⁺ embedded region 18 to the known Schottky diode with trenches as shown in FIG. 42.

With the trenches 16 thus provided, the contact area of the Schottky electrode 15 is increased, with a result of an increase in the current resistance. In addition, the spacing between the outermost trenches 16 is larger than the width of the n⁺ embedded region 18, thus avoiding concentration of the electric field at the outermost trenches, and the breakdown occurs in a small-thickness region of the n drift layer 2. Thus, the Schottky diode 222 of the present embodiment has an increased avalanche current.

Twenty-third Embodiment

Figure 32:
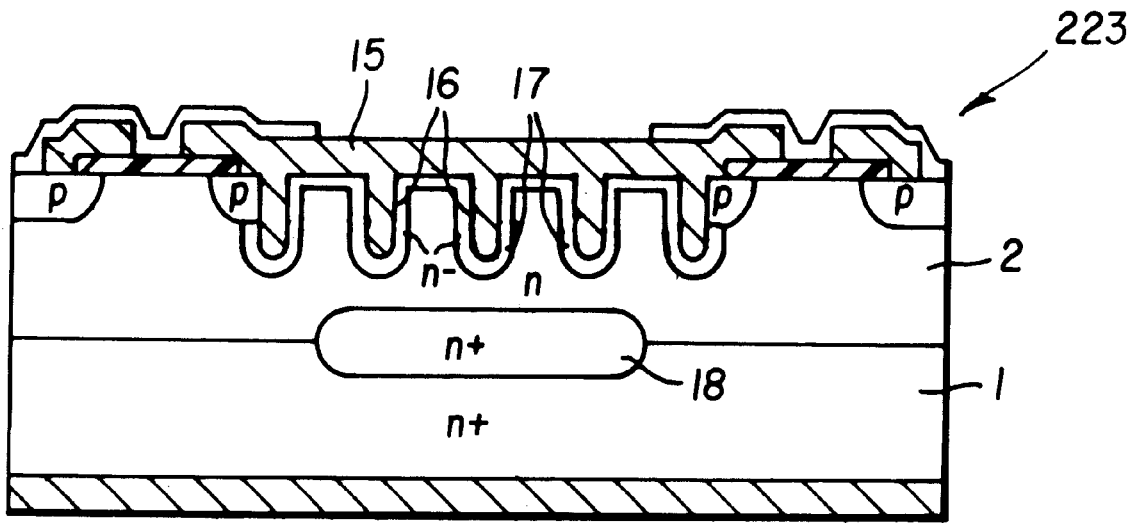
FIG. 32 is a cross-sectional view of a Schottky diode according to the twenty-third embodiment of the invention.

FIG. 32 is a cross-sectional view of a Schottky diode 223 constructed according to the twenty-third embodiment of the present invention. The diode 223 of the present embodiment is obtained by adding an n⁺ embedded region 18 to the Schottky diode 208 of the eighth embodiment shown in FIG. 14.

Accordingly, the leakage current $I_R$ can be reduced due to the high resistivity of the n⁻ high-resistance region 17 that contacts with the Schottky electrode 15, and the contact area of the Schottky electrode 15 is increased by providing the trenches 16, thus assuring increased current capacitance. In addition, since the spacing between the outermost trenches 16 is larger than the width of the n⁺ embedded region 18, the breakdown occurs uniformly in a small-thickness region of the n drift layer 2. Thus, the Schottky diode 223 has an increased avalanche current.

Twenty-fourth Embodiment

Figure 33:
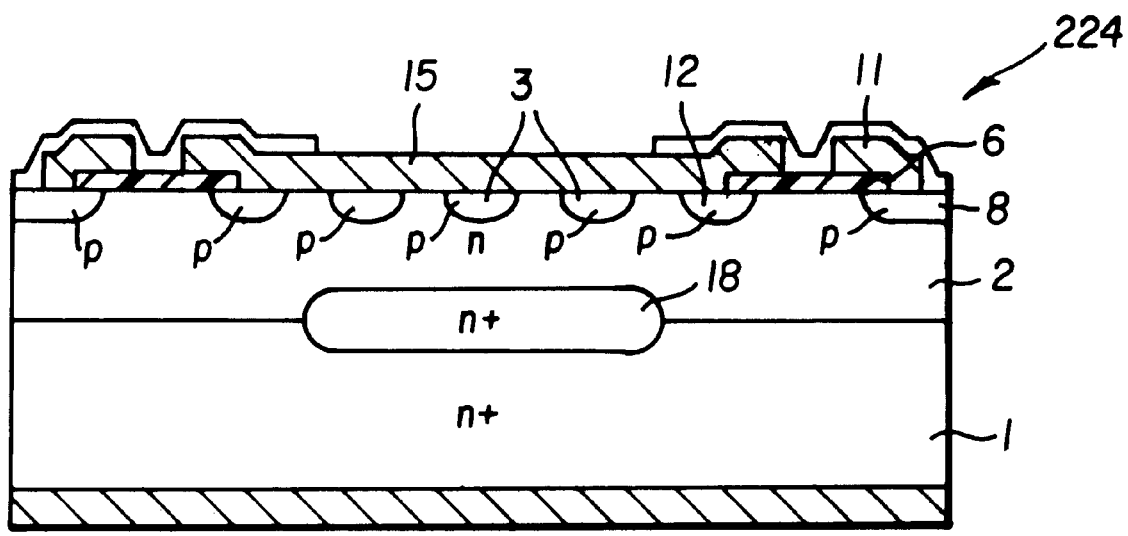
FIG. 33 is cross-sectional view of a composite diode according to the twenty-fourth embodiment of the invention.
Figure 44:
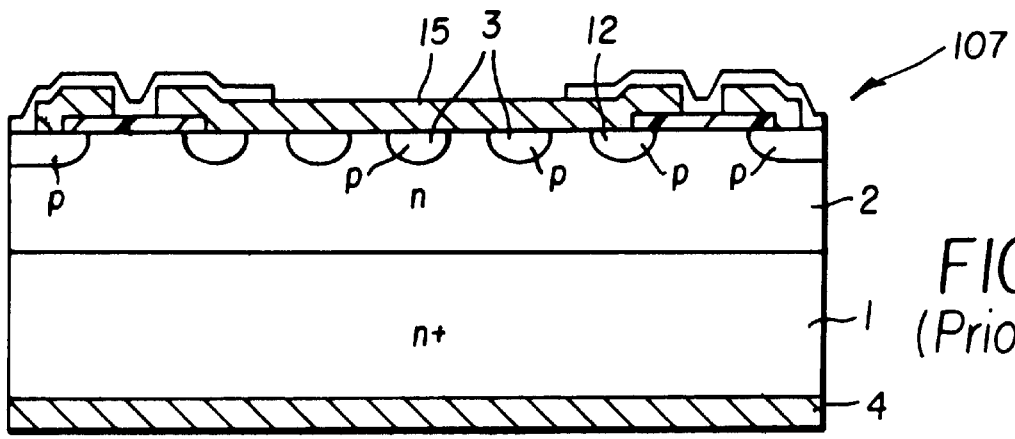
FIG. 44 is a cross-sectional view of another known example of composite diode.

FIG. 33 is a cross-sectional view of a composite diode 224 constructed according to the twenty-fourth embodiment of the present invention. The diode 24 of this embodiment is obtained by adding an n⁺ embedded region 18 to the known composite diode of FIG. 44. A p ring region 12 is formed in a surface layer of an n drift layer 2, and p high-concentration regions 13 having a high surface concentration and a large diffusion depth are formed inside the p ring region 12, such that exposed surfaces of the n drift layer 2 interposed between the p high-concentration regions 13 are in contact with a Schottky electrode 15. Also, the Schottky electrode 15 is in ohmic contact with the p high-concentration regions 13.

In this arrangement, the composite diode 224 having the pn junction and Schottky junction provides a lowered forward voltage as a composite effect of the pn junction diode and Schottky diode, and a fast switching characteristic (high switching speed) as an effect of the Schottky diode. Further, the spacing between opposite portions of the p ring region 12 is larger than the n⁺ embedded region 18, and the thickness of the n drift layer on the n⁺ embedded region 18 is smaller than that of the n drift layer 2 below the p ring region 12. Accordingly, the breakdown occurs uniformly in a small-thickness portion of the n drift layer 2, and the avalanche current of the diode is increased.

If the width of each of the exposed portions of the n drift layer 2 between the p anode regions 3 is reduced, a depletion layer spreads out from the p anode regions 3 upon application of a reverse bias, which yields an effect of reducing the leakage current.

Twenty-fifth Embodiment

Figure 34:
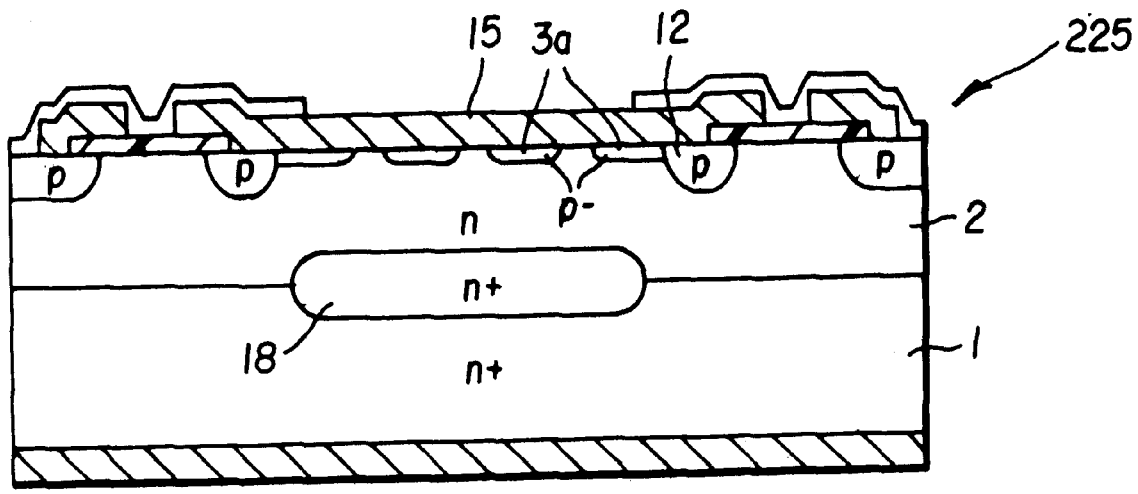
FIG. 34 is a cross-sectional view of a composite diode according to the twenty-fifth embodiment of the invention.

FIG. 34 is a cross-sectional view of a composite diode 225 constructed according to the twenty-fifth embodiment of the present invention. The diode 225 of the present embodiment is obtained by adding an n⁺ embedded region 18 to the composite diode 209 of the ninth embodiment shown in FIG. 15. The spacing between opposite portions of the p ring region 12 is larger than the width of the n⁺ embedded region 18. Also, the thickness of the n drift layer 2 on the n⁺ embedded region 18 is smaller than the thickness of the n drift layer 2 under the p ring region 12.

Accordingly, the composite diode 225 exhibits a low forward-voltage characteristic, a high switching speed and a reduced leakage current as provided by the composite diode 209 of the ninth embodiment. In addition, the diode 225 has an increased avalanche current since the breakdown occurs uniformly in a small-thickness region of the n drift layer 2.

Twenty-sixth Embodiment

Figure 35:
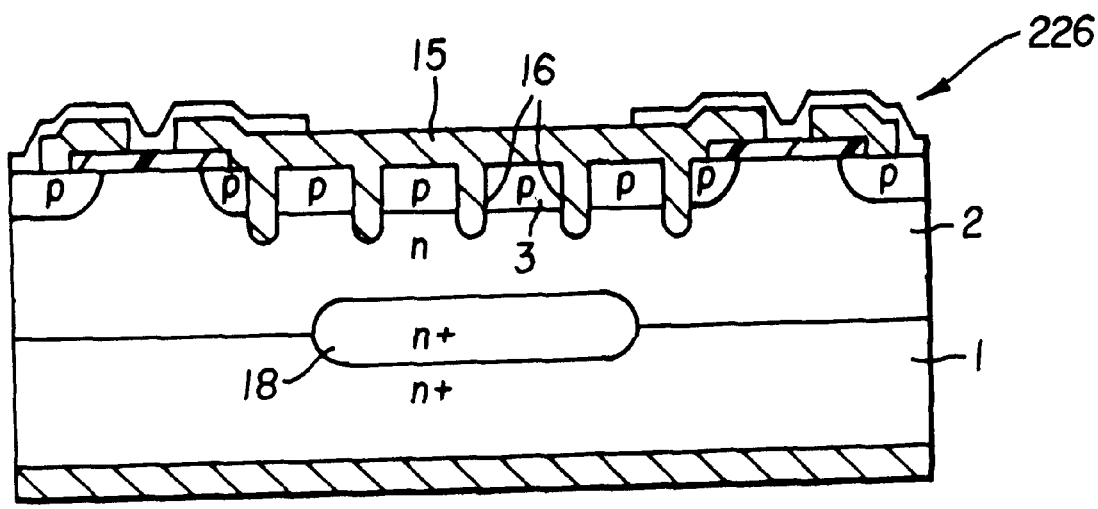
FIG. 35 is a cross-sectional view of a composite diode according to the twenty-sixth embodiment of the invention.
Figure 45:
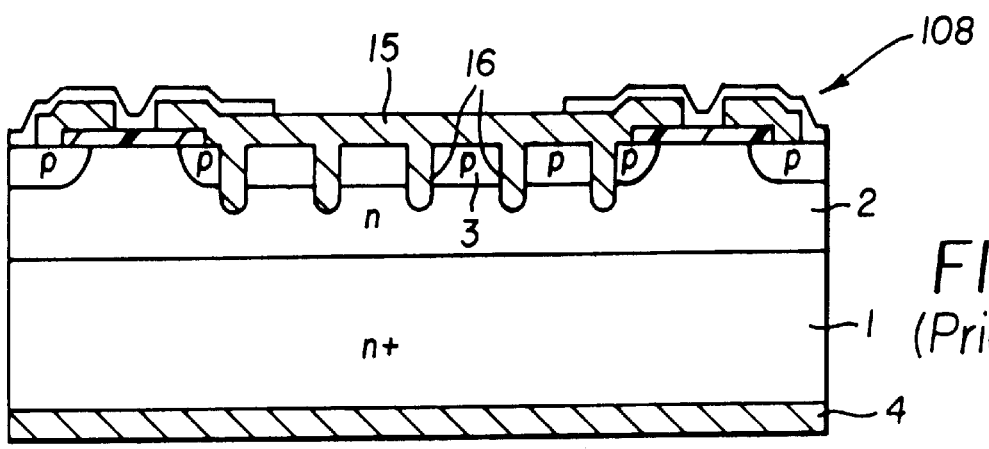
FIG. 45 is a cross-sectional view of a further known example of composite diode.
Figure 46:
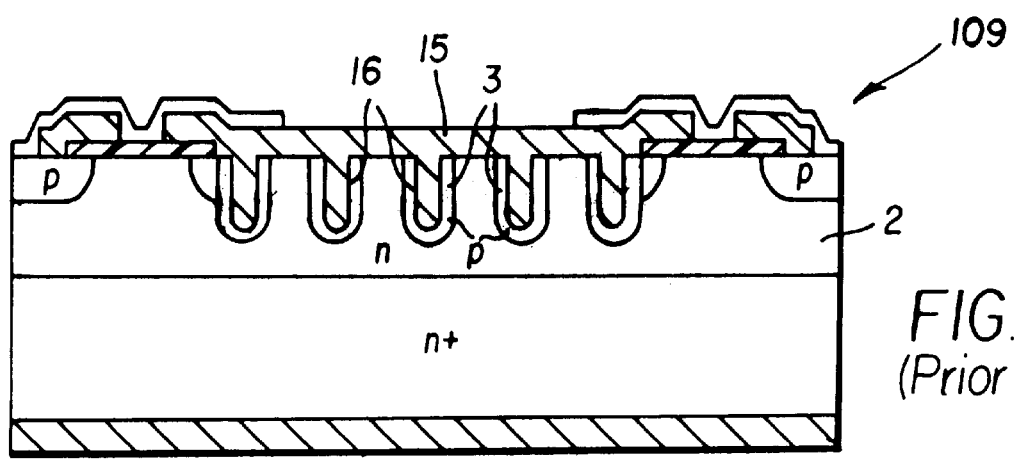
FIG. 46 is a cross-sectional view of a still another known example of composite diode.

FIG. 35 is a cross-sectional view of a composite diode 226 constructed according to the twenty-sixth embodiment of the present invention. The diode 226 of this embodiment is obtained by adding an n⁺ embedded region 18 to the known composite diode 108 provided with trenches as shown in FIG. 45. The spacing between the outermost trenches 16 is larger than the width of the n⁺ embedded region 18.

Accordingly, the composite diode 226 exhibits a low forward-voltage characteristic, a high switching speed, and large current capacitance as provided by the known composite diode 108. In addition, the avalanche breakdown occurs uniformly in a small-thickness region of the n drift layer 2, and thus the avalanche current is increased.

Twenty-seventh Embodiment

Figure 36:
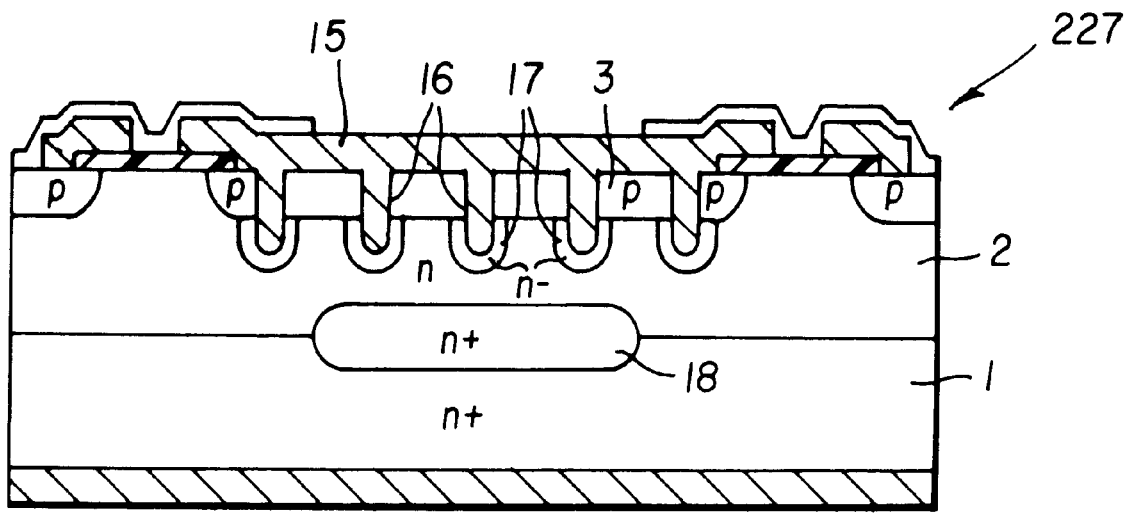
FIG. 36 is a cross-sectional view of a composite diode according to the twenty-seventh embodiment of the invention.

FIG. 36 is a cross-sectional view of a composite diode 227 constructed according to the twenty-seventh embodiment of the present invention. The composite diode 226 of the twenty-sixth embodiment of FIG. 35 is modified into the diode 227 by providing n⁻ high-resistance regions 17 at portions of the n drift layer 2 that contact with the Schottky electrode 16.

Accordingly, the composite diode 227 provides a low forward voltage, and has a fast switching characteristic and a large current capacitance. In addition, the avalanche current is increased since the breakdown occurs uniformly in a small-thickness region of the n drift layer 2, and the leakage current $I_R$ is also reduced.

According to the present invention as explained above, in the pn junction diode including the first-conductivity-type drift layer and the second-conductivity-type anode region, the lowest resistivity of the second-conductivity-type anode region is at least 1/100 of that of the first-conductivity-type drift layer, and the thickness of the anode region is smaller than that of the second-conductivity-type ring region. Preferably, the lowest resistivity of the anode region is 0.3 to 30 times the resistivity of the drift layer, and the thickness of the anode region is controlled to 0.01 to 0.5 μm. With the diode thus constructed, the amount of minority carriers injected into the first-conductivity-type drift layer is significantly reduced, and the carriers accumulated in this layer is also reduced, so that the resulting diode has a reduced reverse recovery time. Where the reverse recovery time of the diode is set to a certain value, the leakage current arising upon application of a reverse bias can be significantly reduced as compared with that of the known diode.

In a method for manufacturing the diode as described above, the second-conductivity-type anode region may be formed by implanting second-conductivity-type ions in a dose amount of $1 \times 10^{10}$ to $1 \times 10^{12}$ cm⁻², and conducting heat treatment at a temperature in a range of 300 to 600° C.

In the Schottky diode wherein the generally ring-like second-conductivity-type ring region is formed in the surface layer of the first-conductivity-type drift layer, and the Schottky electrode is formed in contact with the surface of the semiconductor substrate inside the ring region to form a Schottky junction, the first-conductivity-type high-resistance region is formed in the surface layer of the first conductivity-type drift layer located inside the second-conductivity-type ring region, such that the high-resistance region has a higher resistivity than the first-conductivity-type drift layer, and has a thickness that is smaller than a diffusion depth of the second-conductivity-type ring region. Preferably, the highest resistivity of the high-resistance region is in the range of 1.2 to 12 times the resistivity of the first-conductivity-type drift layer, and its thickness is in the range of 0.01 to 0.5 μm. In this arrangement, the leakage current arising upon application of a reverse bias can be reduced, without deteriorating its characteristics during application of a forward voltage.

In a method for manufacturing such a Schottky diode, the first-conductivity-type high-resistance region is formed by implanting second-conductivity-type ions in a dose amount of $1\times10^{10}$ to $1\times10^{13}$ cm$^{-2}$, preferably, in a dose amount of $1\times10^{10}$ to $1\times10^{12}$ cm$^{-2}$, and conducting heat treatment. The first-conductivity-type high-resistance region may also be formed by epitaxial growth.

In the diode including the first-conductivity-type cathode layer having a high impurity concentration, first-conductivity-type drift layer placed on the cathode layer and having a lower impurity concentration than the cathode layer, and the first-conductivity-type embedded region sandwiched between the cathode layer and the drift layer and having a lower resistivity than the drift layer, the first-conductivity-type embedded region is formed only in the inside of the vertical projection of the second-conductivity-type anode region or second-conductivity-type ring region. The thus constructed diode has a significantly improved ability to withstand avalanche breakdown, since the breakdown occurs uniformly in a broad area that does not include a curved portion of the pn junction having a certain radius of curvature.

In the diode in which trenches are formed in the surface layer of the first-conductivity-type drift layer, the first-conductivity-type embedded region is formed only inside the area bounded by the vertical projection of the outermost trenches, so as to avoid concentration of the electric field. This diode has an improved ability to withstand avalanche breakdown.

The above features of the present invention may be combined to provide a diode which yields the respective effects of the features at the same time. While individual diodes corresponding to the respective embodiments are shown in the figures, the present invention may be applied to diodes that are integrated in semiconductor integrated circuits.

What is claimed is:

1. A method for manufacturing a diode, comprising the steps of:

preparing a first-conductivity-type first region having a first impurity concentration;

forming a first-conductivity-type second region adjoining said first region, said second region having a second impurity concentration that is lower than said first impurity concentration;

forming a second-conductivity-type fourth region in a surface layer of said second region;

forming a first main electrode in contact with said first region; and forming a second main electrode in contact with said fourth region, wherein said fourth region is formed by implanting second-conductivity-type ions in a dose amount of $1\times10^{10}$ to $1\times10^{12}$ cm$^{-2}$, and conducting heat treatment.

2. A method according to claim 1, wherein the heat treatment for forming said fourth region is conducted at a temperature in a range of 300–600° C.

3. A method according to claim 1, further comprising:

forming a generally ring-like second-conductivity-type third region in a surface layer of said second region located outside said fourth region, wherein said fourth region is formed shallower than said third region.

4. A method according to claim 2, further comprising:

forming a generally ring-like second-conductivity-type third region in a surface layer of said second region located outside said fourth region, wherein said fourth region is formed shallower than said third region.

5. A method according to claim 1, wherein a portion of said fourth region having the lowest resistivity is formed to have a resistivity that is at least $\frac{1}{100}$ of that of said first-conductivity-type second region.

6. A method according to claim 2, wherein a portion of said fourth region having the lowest resistivity is formed to have a resistivity that is at least $\frac{1}{100}$ of that of said first-conductivity-type second region.

7. A method according to claim 3, wherein a portion of said fourth region having the lowest resistivity is formed to have a resistivity that is at least $\frac{1}{100}$ of that of said first-conductivity-type second region.

8. A method according to claim 4, wherein a portion of said fourth region having the lowest resistivity is formed to have a resistivity that is at least $\frac{1}{100}$ of that of said first-conductivity-type second region.

9. A method for manufacturing a diode, comprising the steps of:

preparing a first-conductivity-type first region having a first impurity concentration;

forming a first-conductivity-type second region adjoining said first region, said second region having a second impurity concentration that is lower than said first impurity concentration;

forming a second-conductivity-type fourth region in a surface layer of said second region;

forming a first main electrode in contact with said first region; and forming a second main electrode in contact with said fourth region, wherein said fourth region is formed by implanting second-conductivity-type ions and conducting heat treatment at a temperature in a range of 300 to 600° C.

10. A method according to claim 9, further comprising:

forming a generally ring-like second-conductivity-type third region in a surface layer of said second region located outside said fourth region, wherein said fourth region is formed shallower than said third region.

11. A method according to claim 9, wherein a portion of said fourth region having the lowest resistivity is formed to have a resistivity that is at least $\frac{1}{100}$ of that of said first-conductivity-type second region.

12. A method according to claim 10, wherein a portion of said fourth region having the lowest resistivity is formed to have a resistivity that is at least $\frac{1}{100}$ of that of said first-conductivity-type second region.

* * * * *

UNITED STATES PATENT AND TRADEMARK OFFICE
CERTIFICATE OF CORRECTION

| | | |
|---|---|---|
| PATENT NO. | : 6,221,688 B1 | Page 1 of 1 |
| APPLICATION NO. | : 09/386,058 | |
| DATED | : April 24, 2001 | |
| INVENTOR(S) | : Tatsuhiko Fujihira et al. | |

It is certified that error appears in the above-identified patent and that said Letters Patent is hereby corrected as shown below:

On Sheet 21 of 24 of the DRAWINGS: FIG. 36 is incorrectly labeled as Prior Art. The text reading "(Prior Art)" beneath FIG. 36 should be deleted.

Signed and Sealed this

Twenty-third Day of October, 2007

JON W. DUDAS
*Director of the United States Patent and Trademark Office*